United States Patent
Toyoda

(10) Patent No.: US 9,613,945 B1
(45) Date of Patent: Apr. 4, 2017

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Yoshiaki Toyoda, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/232,562

(22) Filed: Aug. 9, 2016

(30) Foreign Application Priority Data

Sep. 16, 2015 (JP) ................................. 2015-183479

(51) Int. Cl.
*H01L 27/02* (2006.01)
*H01L 29/04* (2006.01)
(Continued)

(52) U.S. Cl.
CPC ...... *H01L 27/0255* (2013.01); *H01L 27/0629* (2013.01); *H01L 29/04* (2013.01); *H01L 29/0696* (2013.01); *H01L 29/16* (2013.01); *H01L 29/66106* (2013.01); *H01L 29/7395* (2013.01); *H01L 29/7808* (2013.01); (Continued)

(58) Field of Classification Search
CPC ............. H01L 27/0255; H01L 27/0629; H01L 29/66106; H01L 29/7808; H01L 29/866; H01L 29/7395; H01L 29/1095; H01L 29/0696; H01L 29/7813; H01L 29/04; H01L 29/16; H01L 2224/48137
See application file for complete search history.

(56) References Cited

U.S. PATENT DOCUMENTS 6,323,518 B1* 11/2001 Sakamoto ............... H01L 23/62
257/330
6,385,028 B1* 5/2002 Kouno ................ H01L 27/0629
257/E27.016
(Continued)

FOREIGN PATENT DOCUMENTS

JP S63-019843 A 1/1998
JP 2000-091344 A 3/2000
JP 2003-092414 A 3/2003

*Primary Examiner* — Michael Trinh
(74) *Attorney, Agent, or Firm* — Chen Yoshimura LLP

(57) ABSTRACT

A diffusion diode including a $p^+$ diffusion region, a p-type diffusion region, and an $n^+$ diffusion region is formed in the front surface of a semiconductor substrate. A polysilicon diode including a $p^+$ layer and an $n^+$ layer is formed on top of a local insulating film formed on the front surface of the semiconductor substrate and faces the diffusion diode in the depth direction. The diffusion diode and the polysilicon diode are reverse-connected by electrically connecting the $n^+$ diffusion region to the $n^+$ layer, thereby forming a lateral protection device. The $p^+$ layer and $p^+$ diffusion region are respectively electrically connected to a high voltage first terminal and a low voltage second terminal of the lateral protection device. The polysilicon diode blocks a forward current generated in the diffusion diode when the electric potential of the first terminal becomes lower than the electric potential of the second terminal.

18 Claims, 15 Drawing Sheets

(51) Int. Cl.
*H01L 29/16* (2006.01)
*H01L 29/866* (2006.01)
*H01L 29/66* (2006.01)
*H01L 29/78* (2006.01)
*H01L 29/06* (2006.01)
*H01L 27/06* (2006.01)
*H01L 29/739* (2006.01)

(52) U.S. Cl.
CPC ........ *H01L 29/7813* (2013.01); *H01L 29/866* (2013.01); *H01L 2224/48137* (2013.01)

(56) References Cited

U.S. PATENT DOCUMENTS

| | | | |
|---|---|---|---|
| 8,981,424 B2 * | 3/2015 | Andou | H01L 27/0617 257/140 |
| 9,142,463 B2 * | 9/2015 | Harada | H01L 21/84 |
| 9,478,530 B2 * | 10/2016 | Nakazawa | H01L 27/0255 |
| 2001/0010379 A1 * | 8/2001 | Yoshida | H01L 25/071 257/355 |
| 2006/0006459 A1 * | 1/2006 | Yoshikawa | H01L 27/0629 257/330 |

\* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Power integrated circuits (power ICs) that include both a vertical power semiconductor device and a lateral power semiconductor device for controlling/providing a protection circuit for the vertical power semiconductor device are a well-known conventional technology for increasing the reliability and reducing the size and cost of power semiconductor devices (see Patent Documents 1 and 2, for example). One example of such a conventional power semiconductor device is a power IC that includes an output stage vertical power semiconductor device, a circuit device for a control circuit, and a protection device that are all mounted on the same semiconductor substrate. FIG. 11 is a cross-sectional view illustrating the structure of an example of such a conventional semiconductor device.

The conventional semiconductor device illustrated in FIG. 11 is an example of a high-side power IC for use in a vehicle and includes an output stage vertical power semiconductor device arranged on a vertical trench-gate metal-oxide-semiconductor field-effect transistor (MOSFET) 110. The power IC also includes a lateral p-channel MOSFET and a lateral n-channel MOSFET connected together complementarily to form a lateral complementary MOS (CMOS) that functions as a circuit device for a control circuit. However, FIG. 11 only depicts the lateral n-channel MOSFET 120.

As illustrated in FIG. 11, the conventional semiconductor device includes a single semiconductor substrate (semiconductor chip) 100, which is divided into an output stage portion in which the output stage vertical power semiconductor device is arranged and a circuit portion in which components such as the circuit device for the control circuit and the protection device are arranged. The semiconductor substrate 100 is formed by epitaxially growing an n⁻ semiconductor layer 102 on the front surface of an n⁺ supporting substrate 101. The output stage vertical MOSFET 110 is formed in the output stage portion. In the output stage portion, the n⁺ supporting substrate 101 and the n⁻ semiconductor layer 102 respectively function as an n⁺ drain layer and an n⁻ drift layer. A drain electrode 109 (a drain terminal) is connected to the rear surface of the supporting substrate 100 (that is, to the rear surface of the n⁺ supporting substrate 101) and functions as a supply voltage terminal (hereinafter, "VCC terminal") that is connected to a vehicle battery.

A ground terminal (hereinafter "GND terminal") and an output terminal (hereinafter, "OUT terminal") are formed on the front surface side of the semiconductor substrate 100 (that is, on the side of the n⁻ semiconductor layer 102 opposite to the n⁺ supporting substrate 101 side). The OUT terminal is electrically connected to an n⁺ source region 107 and a p⁺⁺ diffusion region 108 of the vertical MOSFET 110. The vertical MOSFET 110 also includes a trench 103, a gate insulating film 104, a gate electrode 105, and a p-type base region 106. In the circuit portion, elements such as a lateral CMOS for the control circuit and a diffusion diode 130 are formed. A lateral n-channel MOSFET 120 that is part of the lateral CMOS in the circuit portion is arranged within a p-type base region 121 that is selectively formed in the surface layer of the front surface of the substrate.

The diffusion diode 130 is a lateral diode that includes a p-type diffusion region (hereinafter "p-type anode region") 131 that is selectively formed in the surface layer of the front surface of the semiconductor substrate 100 and separated from the p-type base region 121. The diffusion diode 130 functions as a protection device for protecting (providing gate protection for) a gate insulating film 124 of the lateral n-channel MOSFET 120 that is part of the lateral CMOS for the control circuit. A cathode terminal is connected to an n⁺ cathode region 132 of the diffusion diode 130 as well as to a gate electrode (gate terminal) 125 of the lateral n-channel MOSFET 120. Moreover, an anode terminal is connected to a p⁺ anode contact region 133 of the diffusion diode 130 as well as to the GND terminal. The lateral n-channel MOSFET 120 also includes an n⁺ source region 122 and an n⁺ drain region 123.

In the power IC illustrated in FIG. 11, the diffusion diode 130 undergoes breakdown (Zener breakdown), and the breakdown voltage of the diffusion diode 130 is applied to the gate terminal VG of the lateral n-channel MOSFET 120. Furthermore, the breakdown voltage of the diffusion diode 130 is also applied to the gate terminal of the lateral n-channel MOSFET 120 even when a high input voltage (that is, the output control signal of the lateral n-channel MOSFET 120) is used, and therefore a high voltage is not applied to the gate insulating film 124 of the lateral n-channel MOSFET 120. In other words, the diffusion diode 130 clamps (fixes) the input voltage applied to the gate terminal VG of the lateral n-channel MOSFET 120 to a prescribed voltage, thereby also protecting the gate insulating film 124 of the lateral n-channel MOSFET 120.

Meanwhile, if the gate insulating film 124 of the lateral n-channel MOSFET 120 is formed more thickly, the operating voltage (gate voltage) for driving the lateral n-channel MOSFET 120 must be increased. In this case, if the breakdown voltage of the diffusion diode 130 is too low, a sufficiently large gate voltage will not be applied to the lateral n-channel MOSFET 120 even if a high input voltage is used. As a result, a sufficiently large current does not flow between the source and drain of the lateral n-channel MOSFET 120, and the power IC may function abnormally. Therefore, if the breakdown voltage of the diffusion diode 130 is too low when only a single diffusion diode 130 is used, a plurality of diffusion diodes 130 are connected in series to form a multi-stage diode. FIG. 12 is a cross-sectional view illustrating the structure of another example of a conventional lateral protection device.

FIG. 12 illustrates an example of the cross-sectional structure of a multi-stage diffusion diode 130 that includes three stages 130a to 130c arranged in order from the upstream side (that is, from the lateral n-channel MOSFET 120 side (the upper side in the figure)). As illustrated in FIG. 12, connecting together the plurality of diffusion diodes 130a to 130c to form a lateral protection device that provides gate protection for the lateral n-channel MOSFET 120 increases the magnitude of the voltage to which the lateral protection device clamps the input voltage, thereby ensuring that a sufficient gate voltage is applied to the lateral n-channel MOSFET 120. FIG. 12 depicts a case in which the plurality of connected diffusion diodes 130a to 130c are reverse-biased such that a first terminal 136 of the lateral protection device has a higher voltage than a second terminal 137.

As illustrated in FIG. 12, the diffusion diodes 130a to 130c are respectively formed in p-type anode regions 131a to 131c, which are formed separated from one another in the surface layer of the front surface of the semiconductor substrate 100. The lateral protection device also includes $n^+$ cathode regions 132, $p^+$ anode contact regions 133, anode electrodes (anode terminals) 134, and cathode electrodes (cathode terminals) 135. The letters "a" to "c" are appended to the reference characters of these components to indicate which components correspond to the respective diffusion diodes 130a to 130c. The anode electrodes 134a and 134b of the diffusion diodes 130a and 130b are respectively connected to the cathode electrodes 135b and 135c of the downstream diffusion diodes 130b and 130c. In other words, the diffusion diodes 130a to 130c are formed by the p-n junctions in diffusion regions, and the diffusion diodes 130a to 130c are connected together in series.

The cathode electrode 135a of the diffusion diode 130a and the anode electrode 134c of the diffusion diode 130c function as connection points with other components (that is, as the first and second terminals 136 and 137). FIG. 13 illustrates an example of a power IC in which the plurality of connected diffusion diodes 130a to 130c are used as a lateral protection device 141 that provides gate protection for the lateral n-channel MOSFET 120. FIG. 13 is a circuit diagram of a power IC that includes the protection device illustrated in FIG. 12. As illustrated in FIG. 13, the first terminal (cathode terminal) 136 of the lateral protection device is connected to the gate terminal VG of the lateral n-channel MOSFET 120, and the second terminal (anode terminal) 137 of the lateral protection device 141 is connected to the source terminal of the lateral n-channel MOSFET 120. If the gate insulating film of the lateral n-channel MOSFET 120 is formed thickly, a relatively high gate voltage must be applied to the lateral n-channel MOSFET 120 in order to ensure that a sufficient current flows between the source and drain thereof.

Next, the operation of the conventional power IC illustrated in FIG. 13 will be described. The lateral n-channel MOSFET 120 is used in a state output circuit (a diagnosis circuit) or the like, for example, and turns ON and OFF to control the power IC. An output control signal that turns the lateral n-channel MOSFET 120 ON and OFF is input to a first input terminal 144. When the output control signal is in the Low state, the lateral n-channel MOSFET 120 remains in the OFF state. However, when the output control signal is in the Hi state, the lateral n-channel MOSFET 120 is switched ON and current flows through the lateral n-channel MOSFET 120 to outside of the power IC. The output control signal is a high voltage and is decreased using a resistor 142 and the lateral protection device 141. The lateral protection device 141 is reverse-biased and undergoes breakdown, thereby clamping the gate voltage applied to the lateral n-channel MOSFET 120. Therefore, a sufficient voltage that is equal to the breakdown voltage of the lateral protection device 141 is applied to the gate terminal VG of the lateral n-channel MOSFET 120.

Moreover, an output interrupting n-channel MOSFET 143 is arranged between the resistor 142 and the first terminal 136 of the lateral protection device 141. When the lateral n-channel MOSFET 120 is outputting current, the n-channel MOSFET 143 interrupts that output current according to an interrupt control signal sent from an interrupt signal circuit (not illustrated in the figure). For example, the interrupt control signal input to a second input terminal 145 is set to the Hi state when another protection circuit (not illustrated in the figure) detects that the power IC is in an abnormal state, thereby switching ON the n-channel MOSFET 143. This pulls down the voltage applied to the gate of the lateral n-channel MOSFET 120, thereby switching OFF the lateral n-channel MOSFET 120. In this type of power IC, the breakdown voltage of the lateral protection device 141 must be set to a value that is greater than or equal to a threshold voltage sufficient to switch ON the lateral n-channel MOSFET 120 but less than the breakdown voltage of the gate insulating film.

Patent Document 3, for example, discloses a device for use as the diffusion diode in this type of power IC. The device includes a p-type semiconductor region formed beneath a cathode region and an $n^+$ embedded layer formed beneath the p-type semiconductor region, thereby reducing the severity of the parasitic transistor effect that occurs directly beneath the cathode region.

RELATED ART DOCUMENTS

Patent Documents

Patent Document 1: Japanese Patent Application Laid-Open Publication No. S63-019843
Patent Document 2: Japanese Patent Application Laid-Open Publication No. 2000-091344
Patent Document 3: Japanese Patent Application Laid-Open Publication No. 2003-092414

SUMMARY OF THE INVENTION

However, in the conventional power IC described above and illustrated in FIGS. 12 and 13, the lateral protection device 141 is reverse-biased and undergoes breakdown when the output control signal is in the Hi state. At this time, the p-type anode regions 131a and 131b of the diffusion diodes 130a and 130b are clamped to a voltage equal to ⅔ of the breakdown voltage of the lateral protection device 141, and the $p^+$ anode contact regions 133a and 133b of the diffusion diodes 130a and 130b are clamped to a voltage equal to ⅓ of the breakdown voltage of the lateral protection device 141 (here, the number of diodes connected in series determines how the clamping voltages are divided). Moreover, the electric potential of the $n^+$ cathode regions 132a to 132c of the diffusion diodes 130a to 130c is higher than the electric potential of the $p^+$ anode contact regions 133a to 133c, and therefore the parasitic transistors 138a and 138b formed in the vertical (depth) direction in the diffusion diodes 130a and 130b are not activated. Here, the parasitic transistors formed in the vertical direction are the parasitic NPN transistors formed by the $n^-$ semiconductor layer 102 and the p-type base regions and the $n^+$ cathode regions of the diffusion diodes. A parasitic transistor 138c is also formed in the vertical direction in the diffusion diode 130c.

Meanwhile, as illustrated in FIGS. 14 and 15, when the interrupt control signal is set to the Hi state and the output interrupting n-channel MOSFET 143 is switched to the ON state, thereby interrupting the output, the voltage of the first terminal 136 of the lateral protection device becomes lower than the voltage of the second terminal 137. FIG. 14 illustrates a parasitic effect that occurs in the power IC that includes the protection device illustrated in FIG. 12. FIG. 15 is a circuit diagram illustrating an equivalent circuit for the parasitic transistors illustrated in FIG. 14. Here, a sufficient voltage is not applied between the cathodes and anodes of the diffusion diodes 130a to 130c, and therefore the lateral protection device does not undergo breakdown. As a result, the p-type anode region 131b and the $p^+$ anode contact region 133b of the diffusion diode 130b that is arranged in the middle of the diffusion diodes 130a to 130c are electrically floating.

In this state, the base of the vertical parasitic transistor 138b formed in the diffusion diode 130b is in an open state, and therefore a leakage current 151 flows in the vertical direction from a VCC terminal through the parasitic transistor 138b and towards the cathode electrode 135b. As described above, at this time the electric potential of the first terminal 136 is lower than the electric potential of the second terminal 137 in the lateral protection device, and therefore the leakage current 151 proceeds to flow forward to the anode and then the cathode of the diffusion diode 130a that is arranged upstream of the diffusion diode 130b. The leakage current 151 flowing between the anode and the cathode of the diffusion diode 130a then proceeds to become the base current of the vertical parasitic transistor 138a formed in the diffusion diode 130a. As a result, the vertical parasitic transistor 138a formed in the diffusion diode 130a is switched ON.

When the parasitic transistor 138a gets switched ON, a large current 152 flows in the vertical direction from the VCC terminal through the parasitic transistor 138a and towards the cathode electrode 135a. Moreover, the leakage current 151 flowing through the vertical parasitic transistor 138b (an open-base transistor) formed in the diffusion diode 130b increases in magnitude as the operating temperature (junction temperature) increases. Therefore, the current 152 that flows though the diffusion diode 130a in the vertical direction due to the leakage current 151 also increases in magnitude as the operating temperature increases. The currents 151 and 152 are unintended currents that were not accounted for in the design of the circuit (the power IC) and can potentially cause circuit malfunctions, an increase in current consumption, or damage to the circuit.

The present invention was made to solve such problems in the conventional technologies described above and aims to provide a semiconductor device and a method of manufacturing the semiconductor device that make it possible to achieve more reliable operation as well as facilitate miniaturization. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate of a first conductivity type; a first semiconductor region of a second conductivity type that is selectively formed in a surface layer of a front surface of the semiconductor substrate; a second semiconductor region of the first conductivity type that is selectively formed in the first semiconductor region; a third semiconductor region of the second conductivity type that is selectively formed in the first semiconductor region and separated from the second semiconductor region and that has a higher impurity concentration than the first semiconductor region; a fourth semiconductor region of the first conductivity type that is selectively formed on the front surface of the semiconductor substrate with an insulating film interposed therebetween, the fourth semiconductor region being made of a polycrystalline silicon layer; a fifth semiconductor region of the second conductivity type that is selectively formed on the front surface of the semiconductor substrate with the insulating film interposed therebetween, the fifth semiconductor region being made of a polycrystalline silicon layer that contacts the fourth semiconductor region; a first electrode that contacts the second semiconductor region and the fourth semiconductor region; a second electrode that contacts the third semiconductor region; and a third electrode that contacts the fifth semiconductor region, wherein the first semiconductor region faces the fourth semiconductor region and the fifth semiconductor region in a depth direction.

Moreover, in one aspect, the semiconductor device according to the present invention may have a planar layout in which the fourth semiconductor region is arranged in a planar shape that surrounds the second semiconductor region.

Furthermore, in one aspect, the semiconductor device according to the present invention may have a planar layout in which a contact portion between the fourth semiconductor region and the first electrode is arranged in a planar shape that surrounds the second semiconductor region.

In addition, in one aspect, the semiconductor device according to the present invention may have a planar layout in which the fifth semiconductor region is arranged in a planar shape that surrounds the third semiconductor region.

Moreover, in one aspect, the semiconductor device according to the present invention may have a planar layout in which a contact portion between the fifth semiconductor region and the third electrode is arranged in a planar shape that surrounds the third semiconductor region.

Furthermore, in one aspect of the semiconductor device according to the present invention, a first diode is formed by a p-n junction between the first semiconductor region and the second semiconductor region, a second diode is formed by a p-n junction between the fifth semiconductor region and the fourth semiconductor region, and the first diode faces the second diode in the depth direction.

In the semiconductor device according to one aspect of the present invention, a plurality of the first semiconductor regions are arranged in series, separated from one another, wherein each of the plurality of the first semiconductor regions includes the second semiconductor region and the third semiconductor region therein, and has the first electrode connected to the second semiconductor region and the second electrode connected to the third semiconductor region, wherein one of the plurality of the first semiconductor regions that is located at an end of the series has the fourth semiconductor region and the fifth semiconductor region that face the first semiconductor region in the depth direction, and has the third electrode connected to the fifth semiconductor region, wherein the second semiconductor region in the one of the plurality of the first semiconductor regions is electrically connected to the fourth semiconductor region via the first electrode, and wherein the third semiconductor region in respective one of the plurality of the first semiconductor regions is electrically connected to the second semiconductor region in another of the plurality of the first semiconductor regions so that the plurality of the first semiconductor regions with the second and third semiconductor regions are electrically connected in series.

In addition, in the semiconductor device according to one aspect of the present invention, in each of the plurality of the first semiconductor regions, a first diode is formed by a p-n junctions between the first semiconductor region and the second semiconductor region that contacts the first semiconductor region so that a plurality of the first diodes are respectively formed in the plurality of the first semiconductor regions and are electrically connected in series.

Moreover, in the semiconductor device according to one aspect of the present invention, a second diode is formed by a p-n junction between the fifth semiconductor region and the fourth semiconductor region in the one of the plurality of the first semiconductor regions, wherein in the one of the plurality of the first semiconductor regions, the first diode faces the second diode in the depth direction.

Furthermore, in the semiconductor device according to one aspect of the present invention, in the one of the plurality of the first semiconductor regions, an entirety of the first diode faces the second diode in the depth direction.

A semiconductor device unit according to one aspect of the present invention includes: a plurality of the semiconductor devices each as set forth above, wherein the second electrode in respective one of the plurality of the semiconductor devices is electrically connected to, or is shared with, the third electrode in another of the plurality of the semiconductor devices so that the plurality of the semiconductor devices are connected in series.

In addition, in the semiconductor device unit according to one aspect of the present invention, in each of the plurality of the semiconductor devices: a first diode is formed by a p-n junction between the first semiconductor region and the second semiconductor region, a second diode is formed by a p-n junction between the fifth semiconductor region and the fourth semiconductor region, and the first diode faces the second diode in the depth direction.

Moreover, in the semiconductor device unit according to one aspect of the present invention, in each of the plurality of the semiconductor devices, an entirety of the first diode faces, in the depth direction, the second diode.

The semiconductor device according to one aspect of the present invention further includes a semiconductor element on a front surface side of the semiconductor substrate, the semiconductor element having an insulated gate structure made of metal-oxide film-semiconductor; and an input terminal to which a control signal that switches the semiconductor element ON and OFF is input, wherein the third electrode is connected between the input terminal and a gate of the semiconductor element, and wherein when an ON signal is provided to the input terminal, the first diode undergoes breakdown in accordance with the control signal, thereby fixing the third electrode to a higher electric potential than the second electrode.

In addition, in the semiconductor device according to one aspect of the present invention, an impurity concentration of the second semiconductor region is equal to an impurity concentration of the fourth semiconductor region.

Moreover, in the semiconductor device according to one aspect of the present invention, an impurity concentration of the third semiconductor region is equal to an impurity concentration of the fifth semiconductor region.

The semiconductor device according to one aspect of the present invention further includes a vertical semiconductor element that includes a fourth electrode disposed on the front surface of the semiconductor substrate as a front surface electrode, and a fifth electrode disposed on a rear surface of the semiconductor substrate as a rear surface electrode, the fifth electrode being configured to receive a higher electric potential than the fourth electrode.

Moreover, in order to solve the abovementioned problems and achieve the objectives of the present invention, in one aspect, the present disclosure provides a method of manufacturing a semiconductor device that includes a semiconductor substrate of a first conductivity type; a first semiconductor region of a second conductivity type that is selectively formed in a surface layer of a front surface of the semiconductor substrate; a second semiconductor region of the first conductivity type that is selectively formed in the first semiconductor region; a third semiconductor region of the second conductivity type that is selectively formed in the first semiconductor region and separated from the second semiconductor region and that has a higher impurity concentration than the first semiconductor region; a fourth semiconductor region of the first conductivity type that is selectively formed on the front surface of the semiconductor substrate with an insulating film interposed therebetween, the fourth semiconductor region being made of a polycrystalline silicon layer; a fifth semiconductor region of the second conductivity type that is selectively formed on the front surface of the semiconductor substrate with the insulating film interposed therebetween, the fifth semiconductor region being made of a polycrystalline silicon layer that contacts the fourth semiconductor region; a first electrode that contacts the second semiconductor region and the fourth semiconductor region; a second electrode that contacts the third semiconductor region; and a third electrode that contacts the fifth semiconductor region, the method including: selectively forming the first semiconductor region in the surface layer of the front surface of the semiconductor substrate; forming, on the front surface of the semiconductor substrate, the insulating film that covers portions of the first semiconductor region; forming, on the insulating film, a polycrystalline silicon layer that faces the first semiconductor region in a depth direction; selectively forming, via ion implantation, the second semiconductor region within the first semiconductor region, and the fourth semiconductor region in the polycrystalline silicon layer; and selectively forming, via ion implantation, the third semiconductor region within the first semiconductor region, and the fifth semiconductor region in the polycrystalline silicon layer.

In the invention described above, during normal operation the voltage (a second voltage) applied to a device to be protected can be clamped to a voltage equal to the sum of the reverse voltage (breakdown voltage) of the first diode and the forward voltage of the second diode, thereby making it possible to prevent a high voltage from being applied to the device to be protected. Furthermore, the second diode that is made from the polycrystalline silicon layer does not get biased in the reverse direction (in which the variation in voltage can be significant), thereby making it possible to reduce variations in the voltage applied to the device to be protected. In addition, during abnormal operation, any forward current flowing through the first diode is blocked by the second diode, which is reverse-connected upstream (towards the device to be protected) of the first diode. This makes it possible to reduce the impact of the parasitic effects of the first diode. Moreover, no parasitic effects occur in the second diode. This makes it possible to prevent unexpected currents from flowing within the circuit due to the parasitic effects of the diode. Moreover, in the present invention, the second diode is layered on top of the first diode with an insulating film interposed therebetween, thereby making it possible to prevent increases in the area of the device.

The semiconductor device and the method of manufacturing the semiconductor device according to the present invention make it possible to achieve more reliable operation as well as facilitate miniaturization.

It is to be understood that both the foregoing general description and the following detailed description are exemplary and explanatory, and are intended to provide further explanation of the invention as claimed.

DETAILED DESCRIPTION OF EMBODIMENTS

Figure 1:
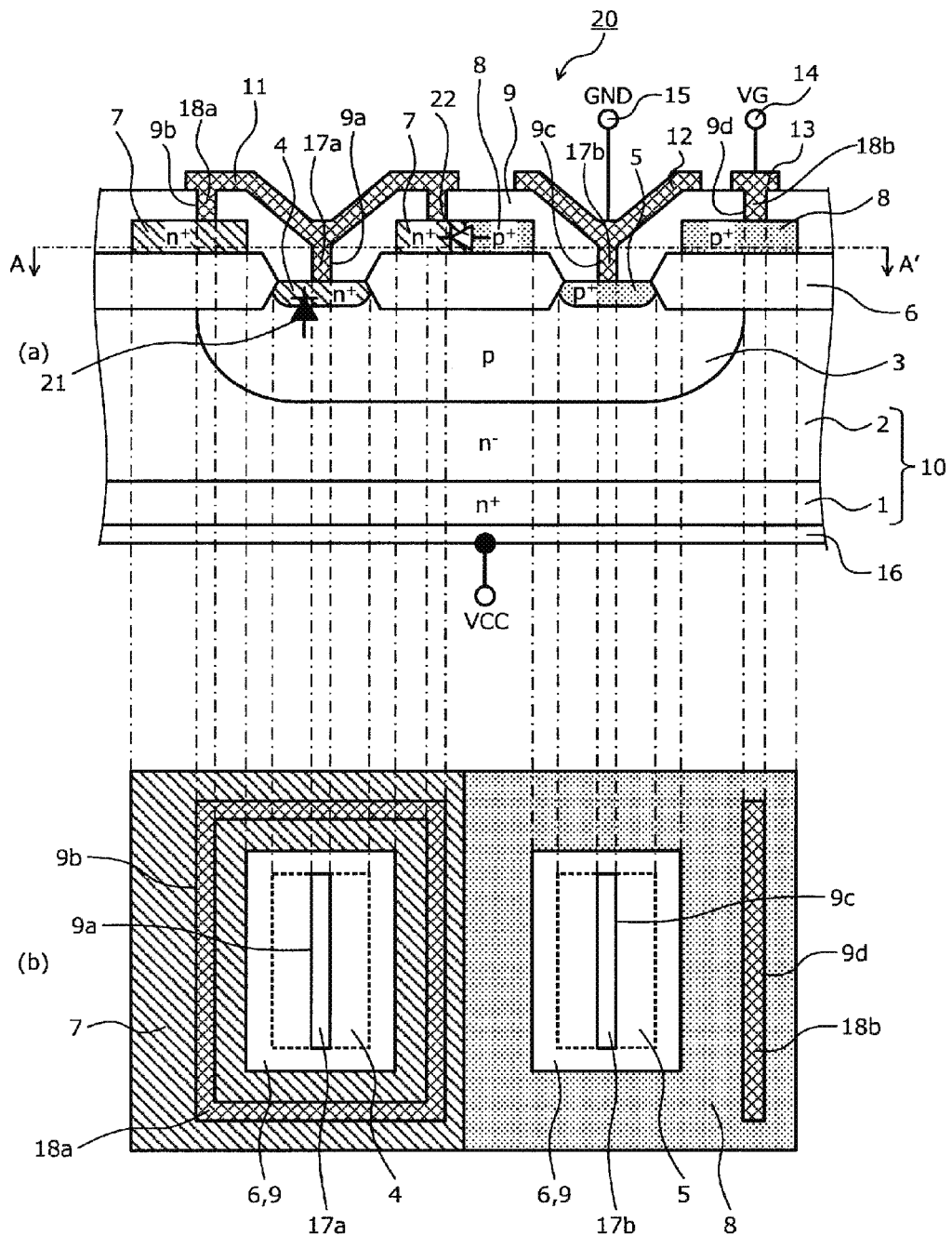
FIG. 1 illustrates the main components of the structure of a semiconductor device according to Embodiment 1.

Preferred embodiments of the semiconductor device and the method of manufacturing a semiconductor device according to various aspects of the present invention will be described in detail below with reference to figures. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower density of impurities, respectively, than layers or regions not labeled with the + or − symbols. In the descriptions of the embodiments and figures, the same reference characters are used to indicate components that are the same, and duplicate descriptions of the same components are omitted.

Embodiment 1

Figure 2:
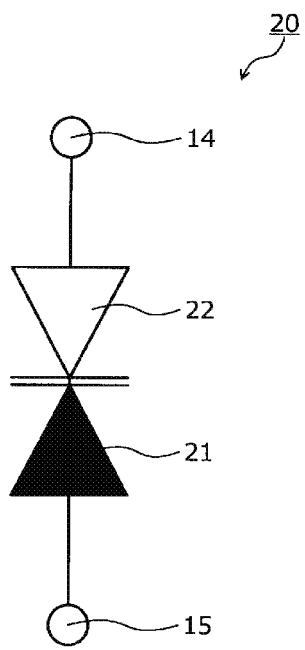
FIG. 2 is a circuit diagram illustrating an equivalent circuit for the configuration illustrated in FIG. 1.

A semiconductor device according to Embodiment 1 includes an n-channel MOSFET and a lateral protection device for protecting (providing gate protection for) a gate insulating film of the n-channel MOSFET, and the n-channel MOSFET and the lateral protection device are both formed on the same semiconductor substrate (semiconductor chip). FIG. 1 illustrates the main components of the structure of the semiconductor device according to Embodiment 1. FIG. 1 only depicts a lateral protection device 20 of the semiconductor device according to Embodiment 1, and other components that are formed in the same semiconductor substrate as the lateral protection device 20 are not illustrated in the figure. FIG. 1($a$) illustrates the cross-sectional structure of the lateral protection device 20, and FIG. 1($b$) is a plan view of a section taken along line A-A' in FIG. 1($a$). FIG. 2 is a circuit diagram illustrating an equivalent circuit for the configuration illustrated in FIG. 1.

As illustrated in FIG. 1, the semiconductor device according to Embodiment 1 includes at least an n-channel MOSFET (not illustrated in the figure) and the lateral protection device that provides gate protection for the n-channel MOSFET, which are both formed on the same semiconductor substrate (semiconductor chip) 10. The lateral protection device 20 includes a Zener diode (hereinafter, a diffusion diode (first diode)) 21 made from a diffusion region formed on the front surface side of the semiconductor substrate 10 and a Zener diode (hereinafter, a polysilicon diode (second diode)) 22 made from a polycrystalline silicon (polysilicon; poly-Si) region also formed on the front surface side of the semiconductor substrate 10. The lateral protection device 20 clamps (fixes) the input voltage applied to a gate terminal VG of the n-channel MOSFET (the device to be protected) to a prescribed voltage.

The semiconductor substrate 10 is formed by epitaxially growing an n$^-$ semiconductor layer 2 on the front surface of an n$^+$ supporting substrate 1. A p-type diffusion region (first semiconductor region) 3 is selectively formed in the surface layer of the front surface (the surface on the n$^-$ semiconductor layer 2 side) of the semiconductor substrate 10. An n$^+$ diffusion region (second semiconductor region) 4 and a p$^+$ diffusion region (third semiconductor region) 5 are selectively formed and separated from one another in the surface layer on the front side of the p-type diffusion region 3. The p-n junction between the p-type diffusion region 3 and the n$^+$ diffusion region 4 form the diffusion diode 21. In other words, the p$^+$ diffusion region 5, the p-type diffusion region 3, and the n$^+$ diffusion region 4 respectively function as a p$^+$ anode contact region, a p-type anode region, and an n$^+$ cathode region, and the resulting p$^+$pn$^+$ junction forms the diffusion diode 21.

A local insulating film 6 such as a local oxidation of silicon (LOCOS) film is formed on the front surface of the semiconductor substrate 10 in regions thereof that are not occupied by the n$^+$ diffusion region 4 or the p$^+$ diffusion region 5. On top of the local insulating film 6, a polysilicon layer is formed surrounding the peripheries of the n$^+$ diffusion region 4 and the p$^+$ diffusion region 5. An n$^+$ layer (fourth semiconductor region) 7 and a p$^+$ layer (fifth semiconductor region) 8 are formed in contact with one another in the polysilicon layer. The p-n junction between the p$^+$ layer 8 and the n$^+$ layer 7 form the polysilicon diode 22. In other words, the n$^+$ layer 7 and the p$^+$ layer 8 respectively function as the n$^+$ cathode region and the p$^+$ anode region of the polysilicon diode 22.

It is preferable that the junction length between the n$^+$ layer 7 and the p$^+$ layer 8 be increased by making the surface area (that is, the area occupied on the front surface on the substrate) of the n$^+$ layer 7 and the p$^+$ layer 8 as large as possible, thereby reducing the operating resistance of the polysilicon diode 22 by reducing contact resistance (as will be described in more detail later). FIG. 1 illustrates an example of a suitable planar layout configuration in which the $p^+$ layer 8 is formed in a substantially rectangular frame-shaped planar shape that surrounds the periphery of the $p^+$ diffusion region 5 and the $n^+$ layer 7 is formed in a substantially rectangular frame-shaped planar shape that surrounds the periphery of the $n^+$ diffusion region 4. However, the planar layout of the $n^+$ layer 7 and the $p^+$ layer 8 is not limited to this example, and various modifications may be made. It is preferable that the impurity concentration of the $n^+$ layer 7 be substantially equal to the impurity concentration of the $n^+$ diffusion region 4. It is also preferable that the impurity concentration of the $p^+$ layer 8 be substantially equal to the impurity concentration of the $p^+$ diffusion region 5. This makes it possible to ensure that the diffusion diode 21 and the polysilicon diode 22 have substantially the same electrical properties without having to perform any additional processes or the like. In this case, the $n^+$ diffusion region 4, the $p^+$ diffusion region 5, the $n^+$ layer 7, and the $p^+$ layer 8 may be formed as follows, for example.

First, using a standard method, the p-type diffusion region 3 is selectively formed in the surface layer of the front surface of the semiconductor substrate 10, and the local insulating film 6 is formed selectively covering the p-type diffusion region 3 such that the regions in which the $n^+$ diffusion region 4 and the $p^+$ diffusion region 5 will be formed are exposed. Next, a thin insulating film is formed on the front surface of the semiconductor substrate 10, and a polysilicon layer is deposited on the thin insulating film. The polysilicon layer is then patterned using photolithography and etching, thereby leaving a polysilicon layer of a prescribed planar shape on top of the local insulating film 6. Then, a mask is formed with openings in the regions corresponding to where the $n^+$ diffusion region 4 and the $n^+$ layer 7 will be formed, and as part of a single ion implantation process, the $n^+$ diffusion region 4 is selectively formed in the surface layer of the p-type diffusion region 3 and the $n^+$ layer 7 is selectively formed in the polysilicon layer. Moreover, a mask may be formed with openings in the regions corresponding to where the $p^+$ diffusion region 5 and the $p^+$ layer 8 will be formed, and as part of the same ion implantation process, the $p^+$ diffusion region 5 may be selectively formed in the surface layer of the p-type diffusion region 3 and the $p^+$ layer 8 may be selectively formed in the polysilicon layer.

It is preferable that the diffusion diode 21 and the polysilicon diode 22 have approximately the same external planar dimensions on the front surface of the substrate. It is also preferable that at least a portion of the diffusion diode 21 and at least a portion of the polysilicon diode 22 are arranged facing one another in the depth direction. The external planar dimensions of the diffusion diode 21 on the front surface of the substrate are determined by the planar shape of the p-type diffusion region 3. The external planar dimensions of the polysilicon diode 22 on the front surface of the substrate are determined by the planar shapes of the $n^+$ layer 7 and the $p^+$ layer 8. In other words, the lateral protection device 20 has a layered structure in which the polysilicon diode 22 is layered on top of the diffusion diode 21 with the local insulating film 6 arranged therebetween. This configuration makes it possible to reduce any potential increases in the area of the device. A plurality of the diffusion diodes 21 may be formed and connected together in series. If a plurality of the diffusion diodes 21 are formed, the polysilicon diode 22 is layered at least on top of the diffusion diode 21 arranged furthest upstream (that is, towards the n-channel MOSFET, which is the device to be protected) and is connected to the cathode of that diffusion diode 21.

An interlayer insulating film 9 is formed on the front surface of the substrate, and a plurality of contact holes $9a$ to $9d$ are formed going through the interlayer insulating film 9 in the depth direction thereof, thereby respectively exposing the $n^+$ diffusion region 4, the $n^+$ layer 7, the $p^+$ diffusion region 5 and the $p^+$ layer 8. A first metal wire 11 (first electrode) is filled into the contact holes $9a$ and $9b$ and contacts the $n^+$ diffusion region 4 and the $n^+$ layer 7. The first metal wire 11 functions as the cathode electrode (cathode terminal) of the diffusion diode 21 and the polysilicon diode 22 and is electrically connected to the $n^+$ diffusion region 4 of the diffusion diode 21 and the $n^+$ layer 7 of the polysilicon diode 22. The first metal wire 11 is formed running on top of the interlayer insulating film 9 and is arranged facing the $n^+$ diffusion region 4 and the $n^+$ layer 7 in the depth direction, for example.

The portion of the first metal wire 11 on top of the interlayer insulating film 9 has a substantially rectangular planar shape that extends from a position facing the $n^+$ diffusion region 4 in the depth direction to a position facing the $n^+$ layer 7. A contact portion $17a$ of the first metal wire 11 that contacts the $n^+$ diffusion region 4 (that is, the portion filled into the contact hole $9a$) has a substantially linear planar shape that extends in the same direction in which the $n^+$ diffusion region 4 extends (hereinafter, a "first direction"), for example. Here, the "direction in which the $n^+$ diffusion region 4 extends" refers to the direction orthogonal to the direction in which the $n^+$ diffusion region 4 and the $p^+$ diffusion region 5 are lined up. A contact portion $18a$ of the first metal wire 11 that contacts the $n^+$ layer 7 (that is, the portion filled into the contact hole $9b$) has a substantially rectangular frame-shaped planar shape that surrounds the periphery of the $n^+$ diffusion region 4, for example.

A second metal wire (second electrode) 12 is filled into the contact hole $9c$ and contacts the $p^+$ diffusion region 5. The second metal wire 12 functions as the anode electrode (anode terminal) of the diffusion diode 21. The second metal wire 12 is formed running on top of the interlayer insulating film 9 and is arranged facing the $p^+$ diffusion region 5 in the depth direction, for example. The portion of the second metal wire 12 on top of the interlayer insulating film 9 has a substantially rectangular planar shape that covers the entire $p^+$ diffusion region 5 with the interlayer insulating film 9 interposed therebetween. A contact portion $17b$ of the second metal wire 12 (that is, the portion filled into the contact hole $9c$) has a substantially linear planar shape that extends in the same direction in which the $p^+$ diffusion region 5 extends (the first direction), for example.

A third metal wire (third electrode) 13 is filled into the contact hole $9d$ and contacts the $p^+$ layer 8. The third metal wire 13 functions as the anode electrode (anode terminal) of the polysilicon diode 22. The third metal wire 13 is formed running on top of the interlayer insulating film 9 and is arranged facing the $p^+$ layer 8 in the depth direction. The portion of the third metal wire 13 on top of the interlayer insulating film 9 may be arranged in any manner as long as the third metal wire 13 does not contact the first or second metal wires 11 and 12. For example, the third metal wire 13 may have a substantially linear shape that runs along one side of the $p^+$ layer 8 with the interlayer insulating film 9 interposed therebetween. In this case, a contact portion $18b$ of the third metal wire 13 (that is, the portion filled into the contact hole $9d$) has a substantially linear planar shape that contacts one side of the $p^+$ diffusion region 8.

Alternatively, the portion of the third metal wire 13 on top of the interlayer insulating film 9 may have a substantially rectangular frame-shaped planar shape that runs along three sides of the p$^+$ layer 8 with one side left open (that is, a substantially U-shaped planar shape) or a substantially rectangular frame-shaped planar shape that surrounds the periphery of the second metal wire 12 and runs along all four sides of the p$^+$ layer 8. In this case, the contact portion 18*b* of the third metal wire 13 may have a substantially U-shaped or rectangular frame-shaped planar shape that surrounds the periphery of the contact portion 17*b* of the second metal wire 12, thereby making it possible to increase the contact length. This makes it possible to reduce the contact resistance of the third metal wire 13. FIG. 1 depicts a case in which the third metal wire 13 has a substantially linear planar shape that runs along one side of the p$^+$ layer 8 and is arranged on the side of the second metal wire 12 opposite to the first metal wire 11 side.

The cathode of the diffusion diode 21 and the cathode of the polysilicon diode 22 are electrically connected to one another via the first metal wire 11. The third metal wire 13 (the anode electrode of the polysilicon diode 22) functions as a first terminal 14 of the lateral protection device 20, and the second metal wire 12 (the anode electrode of the diffusion diode 21) functions as a second terminal 15 of the lateral protection device 20. The first terminal 14 functions as a high voltage terminal on the high voltage side of the lateral protection device 20, and the second terminal 15 functions as a low voltage terminal on the low voltage side of the lateral protection device 20. When using the lateral protection device 20 to clamp the gate voltage applied to an n-channel MOSFET, for example, the first terminal 14 of the lateral protection device 20 is connected to the gate terminal VG of the n-channel MOSFET, and the second terminal 15 is connected to the source terminal of the same n-channel MOSFET.

When a plurality of diffusion diodes 21 are connected together in series, the first and second metal wires 11 and 12 are formed for each diffusion diode 21, and the polysilicon diode 22 is layered on top of at least the diffusion diode 21 that is arranged furthest upstream. When the polysilicon diode 22 is layered on top of just the diffusion diode 21 that is arranged furthest upstream, the second metal wire 12 of each diffusion diode 21 is connected to the first metal wire 11 of the next downstream diffusion diode 21. The second metal wire 12 of the diffusion diode 21 that is arranged furthest downstream then becomes the second terminal 15 of the lateral protection device 20 (FIG. 6A(a) illustrates an equivalent circuit and will be described later). Alternatively, if polysilicon diodes 22 are layered on top of all of the diffusion diodes 21, for example, the third metal wire 13 is formed for each polysilicon diode 22. In this case, the third metal wire 13 of each polysilicon diode 22 is connected to the second metal wire 12 of the next upstream diffusion diode 21. Moreover, the third metal wire 13 of the polysilicon diode 22 that is arranged furthest upstream becomes the first terminal 14 of the lateral protection device 20 (FIG. 6B(a) illustrates an equivalent circuit and will be described later).

The contact portions 17*a* and 18*a* of the first metal wire 11, the contact portion 17*b* of the second metal wire 12, and the contact portion 18*b* of the third metal wire 13 may be made from carbon nanotubes (CNT), for example. Moreover, the portions of the first to third metal wires 11 to 13 on top of the interlayer insulating film 9 may be made from any commonly used electrode material (such as a metal), for example. A rear surface electrode 16 (a fifth electrode) is formed on the rear surface of the semiconductor substrate 10 (that is, the rear surface of the n$^+$ supporting substrate 1). The rear surface electrode 16 functions as a VCC terminal on the high voltage side of a vertical semiconductor device (for example, on the drain side if the vertical semiconductor device is a MOSFET) formed in the semiconductor substrate 10 (note that this vertical semiconductor device is not illustrated in the figure).

Figure 3:
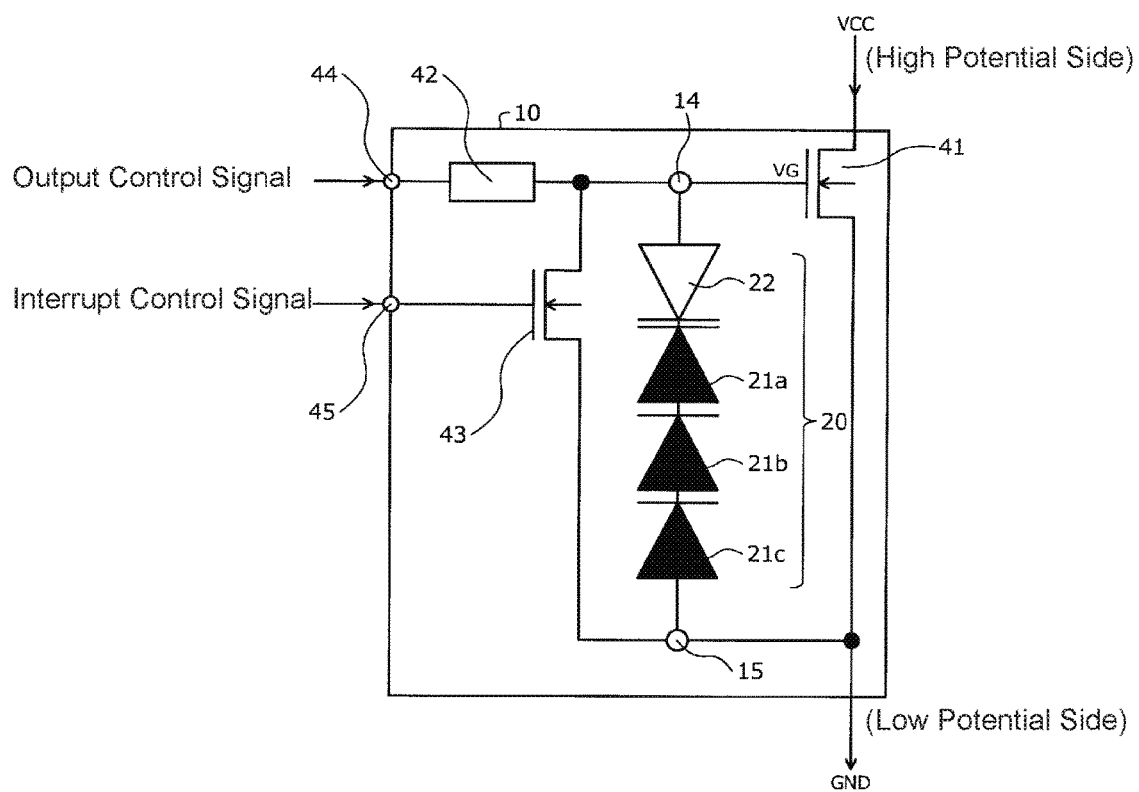
FIG. 3 is a circuit diagram illustrating an example of a circuit configuration for the semiconductor device according to Embodiment 1.
Figure 4:
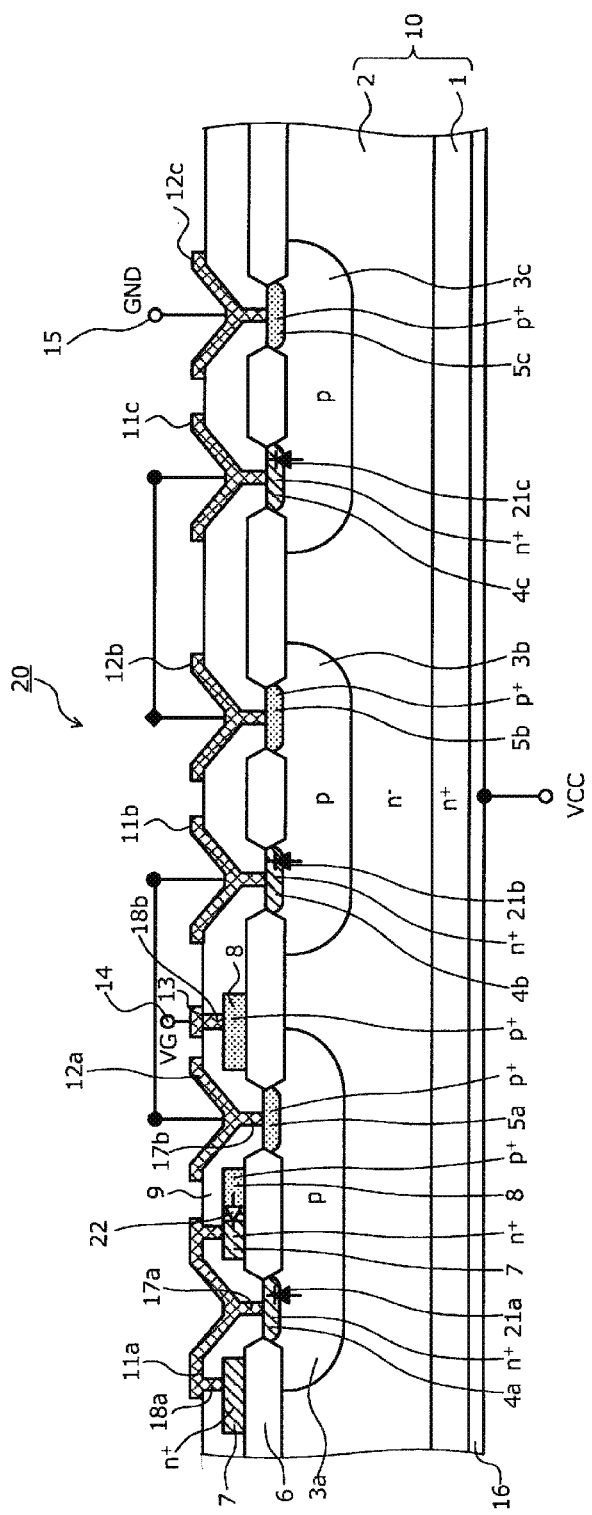
FIG. 4 is a cross-sectional view illustrating the example of the semiconductor device according to Embodiment 1.

Next, an example in which the lateral protection device 20 is used to provide gate protection for an n-channel MOSFET will be described as an example of a power IC in which the lateral protection device 20 is used. FIG. 3 is a circuit diagram illustrating an example of a circuit configuration for the semiconductor device according to Embodiment 1. FIG. 4 is a cross-sectional view illustrating the example of the semiconductor device according to Embodiment 1. FIG. 4 illustrates the cross-sectional structure of the lateral protection device 20 illustrated in FIG. 3. As illustrated in FIGS. 3 and 4, the first terminal 14 of the lateral protection device 20 is connected between a first input terminal 44 and a gate terminal VG of an n-channel MOSFET (hereinafter, "first MOSFET") 41 for outputting current. The second terminal 15 of the lateral protection device 20 is connected to the source terminal of the first MOSFET 41. Moreover, a resistor 42 is connected between the first input terminal 44 and the first terminal 14 of the lateral protection device 20. The lateral protection device 20 and the resistor 42 step down the voltage of a high voltage output control signal input to the first input terminal 44 from an external device.

The lateral protection device 20 includes at least one polysilicon diode 22 arranged furthest upstream (that is, on the first MOSFET 41 side) and connected to the first terminal 14 and one or more downstream diffusion diodes 21 that are reverse-connected to the polysilicon diode 22. During normal operation when the output control signal is set to a Hi state, the diffusion diode 21 of the lateral protection device 20 undergoes breakdown (Zener breakdown), thereby clamping the input voltage applied to the gate terminal VG of the first MOSFET 41 to a prescribed voltage. The prescribed clamping voltage of the lateral protection device 20 is equal to the sum of the reverse voltage (breakdown voltage) of the diffusion diodes 21 and the forward voltage of the second diode and can be adjusted by adjusting the number of diffusion diodes 21 that are connected in series. The prescribed clamping voltage of the lateral protection device 20 is set to a value at which a gate voltage that is large enough to make a current of a prescribed magnitude flow between the source and drain of the first MOSFET 41 is applied to the gate terminal VG of the first MOSFET 41.

The number of diffusion diodes 21 is determined by the thickness of the gate insulating film of the first MOSFET 41, the design requirements (such as current output performance) for the first MOSFET 41, limitations of the process used to form the diffusion diodes 21, or the like, for example. A single polysilicon diode 22 may be arranged at least at the furthest upstream position, or a plurality of polysilicon diodes 22 (less than or equal to the number of diffusion diodes 21) may be used. Increasing the number of polysilicon diodes 22 used makes it possible to more effectively block leakage currents that occur during abnormal operation (this will be described in more detail later). A configuration of the lateral protection device in which a plurality of the polysilicon diodes 22 are used will be described later (see FIGS. 6B(a) and 10). FIGS. 3 and 4 depict a case in which the lateral protection device 20 includes a single polysilicon diode 22 and a plurality of diffusion diodes 21 (here, three diffusion diodes 21a to 21c arranged in order from the upstream side) that are connected together in series downstream of the polysilicon diode 22.

The diffusion diodes 21a to 21c all have the same configuration. In other words, in this case three p-type diffusion regions 3a to 3c in which the diffusion diodes 21a to 21c will be formed are formed separated from one another in the semiconductor substrate 10. Moreover, $n^+$ diffusion regions 4a to 4c and $p^+$ diffusion regions 5a to 5c are selectively formed in the p-type diffusion regions 3a to 3c, respectively. Second metal wires 12a and 12b contact $p^+$ diffusion regions 5a and 5b of the diffusion diodes 21a and 21b and are respectively connected to first metal wires 11b and 11c that contact $n^+$ diffusion regions 4b and 4c of the downstream diffusion diodes 21b and 21c. Furthermore, the polysilicon diode 22 is layered on top of the furthest upstream diffusion diode 21a with a local insulating film 6 interposed therebetween and is reverse-connected to the diffusion diode 21a. The third metal wire 13 contacts the $p^+$ layer 8 of the polysilicon diode 22 and functions as the first terminal 14 of the lateral protection device 20. A second metal wire 12c contacts a $p^+$ diffusion region 5c of the diffusion diode 21c and functions as the second terminal 15 of the lateral protection device 20.

The anode of the polysilicon diode 22 functions as the first terminal 14 of the lateral protection device 20, and the cathode of the polysilicon diode 22 is connected to the cathode of the downstream diffusion diode 21a. The anodes of the diffusion diodes 21a and 21b are respectively connected to the cathodes of the downstream diffusion diodes 21b and 21c. The anode of the diffusion diode 21c functions as the second terminal 15 of the lateral protection device 20. During normal operation when the output control signal is set to the Hi state, all of the diffusion diodes 21a to 21c are reverse-biased. Therefore, increasing the number of diffusion diodes 21 used makes it possible to increase the clamping voltage of the lateral protection device 20. This makes it possible to apply a gate voltage that is large enough to make a current of a prescribed magnitude flow between the source and drain of the first MOSFET 41 to the gate terminal VG of the first MOSFET 41 even when the gate insulating film of the first MOSFET 41 is relatively thick.

The drain terminal of an output interrupting n-channel MOSFET (hereinafter, "second MOSFET") 43 is connected between the resistor 42 and the first terminal 14 of the lateral protection device 20. The source terminal of the second MOSFET 43 is connected to the source terminal of the first MOSFET 41. The second MOSFET 43 is switched ON when an interrupt control signal generated by an interrupt signal circuit (not illustrated in the figure) and input to a second input terminal 45 is set to a Hi state, thereby interrupting the current output of the first MOSFET 41. During normal operation, the interrupt control signal is set to a Low state and the second MOSFET 43 is in the OFF state, and the first terminal 14 of the lateral protection device 20 has a higher electric potential than the second terminal 15. Meanwhile, when abnormal operation occurs, the interrupt control signal is set to the Hi state and the second MOSFET 43 is switched ON, and the electric potential of the first terminal 14 of the lateral protection device 20 becomes substantially equal to the electric potential of the second terminal 15.

Figure 5:
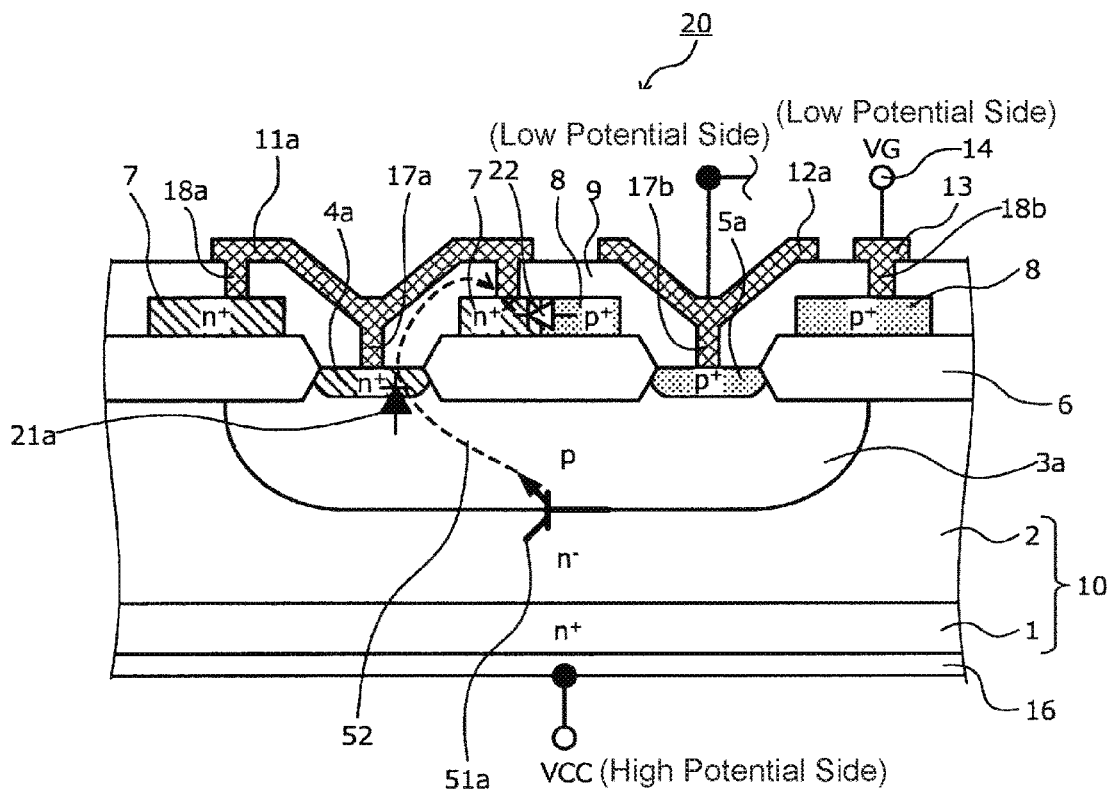
FIG. 5 illustrates the operation of the semiconductor device according to Embodiment 1.
Figure 6A:
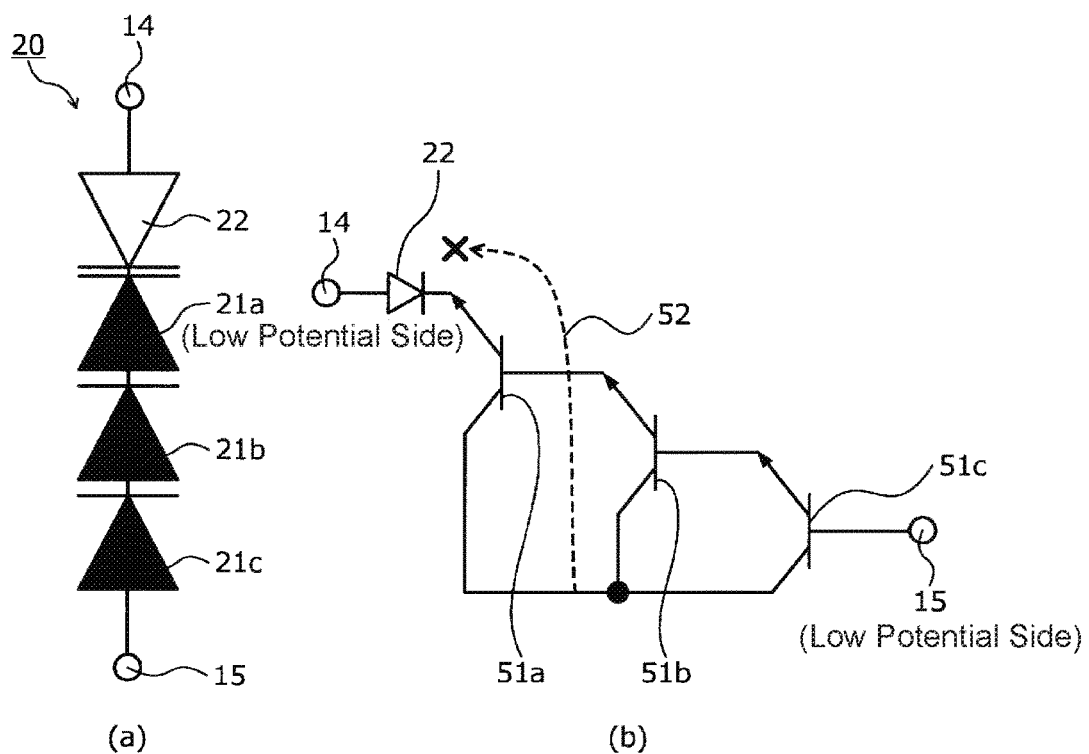
FIG. 6A includes an equivalent circuit for the configuration illustrated in FIG. 4 and illustrates how a parasitic effect occurs.

Next, an example of how the operation of the lateral protection device 20 protects the gate terminal VG of the first MOSFET 41 will be described. Here, the lateral protection device 20 includes a single polysilicon diode 22 and three diffusion diodes 21 as illustrated in FIGS. 3 and 4. FIG. 5 illustrates the operation of the semiconductor device according to Embodiment 1. FIG. 6A includes an equivalent circuit for the configuration illustrated in FIG. 4 and illustrates how a parasitic effect occurs. FIG. 6A(a) is an equivalent circuit of the lateral protection device 20 illustrated in FIG. 4, and FIG. 6A(b) is an equivalent circuit illustrating the parasitic effect. FIG. 5 only depicts the polysilicon diode 22 and the next downstream diffusion diode 21a of the lateral protection device 20 illustrated in FIG. 4, and the other downstream diffusion diodes 21b and 21c and other components are not illustrated in the figure. An output control signal that turns the first MOSFET 41 ON and OFF is input to the first input terminal 44. The input voltage (the output control signal) is stepped down by the resistor 42 and the lateral protection device 20.

While the output control signal remains in a Low state, the first MOSFET 41 remains in the OFF state. However, when the output control signal is set to a Hi state, the polysilicon diode 22 gets forward-biased and the diffusion diodes 21a to 21c get reverse-biased and undergo breakdown.

As a result, the voltage applied to the gate terminal VG of the first MOSFET 41 (the gate voltage) is clamped to a voltage equal to the sum of the breakdown voltage of the diffusion diodes 21a to 21c and the forward voltage of the polysilicon diode 22. This switches ON the first MOSFET 41, and current flows through the first MOSFET 41 to outside of the semiconductor device. If the thickness of the gate insulating film of the first MOSFET 41 is 500 Å and the reverse voltage of the diffusion diode 21 is assumed to be approximately 6V for a diffusion diode 21 formed using a typical ion implantation process, for example, three of the diffusion diodes 21 may be connected in series. In this case, if the forward voltage of the polysilicon diode 22 is approximately 0.6V, then the clamping voltage of the lateral protection device 20 (that is, the gate voltage applied to the first MOSFET 41) is approximately 18.6V ($=3 \times 6V + 0.6V$), for example.

Meanwhile, when another protection circuit (not illustrated in the figure) detects that the power IC is in an abnormal operation state, the interrupt control signal input to the second input terminal 45 is set to the Hi state. As illustrated in FIGS. 5 and 6A(b), this switches ON the output interrupting second MOSFET 43, thereby pulling down the voltage applied to the gate of the first MOSFET 41 and switching OFF the first MOSFET 41. As a result, the electric potential of the first terminal 14 of the lateral protection device 20 becomes substantially equal to the electric potential of the second terminal 15. Furthermore, the p-type diffusion region (p-type anode region) of the diffusion diode 21b that is arranged in the middle position of the connected diffusion diodes 21a to 21c transitions to a floating state, and the base of a parasitic transistor 51b formed in the vertical direction in the diffusion diode 21b transitions to an open state. In Embodiment 1, the parasitic transistors formed in the vertical direction refer to the parasitic NPN transistors formed by the $n^-$ semiconductor layer 2 and the p-type diffusion region 3 and the $n^+$ diffusion region 4 of each diffusion diode 21.

When the base of the parasitic transistor 51b is in the open state, a leakage current 52 flows from the VCC terminal through the parasitic transistor 51b and the first metal wire (the cathode electrode, which is not illustrated in the figure) of the diffusion diode 21b and towards the second metal wire 12 (the anode electrode) of the upstream diffusion diode 21a. This leakage current 52 flows towards the first metal wire 11 of the diffusion diode 21a, but the polysilicon diode 22 is reverse-connected to the first metal wire 11 of the diffusion diode 21a. Therefore, the polysilicon diode 22 gets reverse-biased and blocks the leakage current 52. As a result, no base current flows to a parasitic transistor 51a formed in the vertical direction in the diffusion diode 21a. This makes it possible to prevent unexpected currents from flowing within the circuit (the power IC) due to the parasitic effects of the diffusion diodes 21a to 21c during abnormal operation. In FIGS. 5 and 6A(b), the x symbol indicates that the leakage current 52 is blocked by the polysilicon diode 22. The circuit is designed such that during normal operation, the voltage between the gate and source of the first MOSFET 41 never becomes negative, and therefore a reverse voltage is never applied to the polysilicon diode 22. Therefore, the reverse breakdown voltage of the polysilicon diode 22 may be left as-is at the approximately 4V to 5V reverse breakdown voltage obtained when the polysilicon diode 22 is formed using a typical ion implantation process, for example.

Assume that the diffusion diodes 21a to 21c are replaced using polysilicon diodes, for example. In this case, no parasitic transistors are formed in the polysilicon diodes, thereby making it possible to prevent any unexpected currents from flowing due to the parasitic effects of the diodes. However, the variation in the reverse voltage of polysilicon diodes is significantly larger than the variation in the reverse voltage of diffusion diodes, which can potentially cause non-uniform performance in the resulting power IC devices. Furthermore, if the polysilicon diode 22 is replaced using a diffusion diode, the parasitic effect that occurs when the diffusion diode is forward-biased can cause unexpected currents to flow within the circuit. However, in at least one aspect of the present invention, during normal operation the diffusion diodes 21a to 21c are reverse-biased and the polysilicon diode 22 is forward-biased. The variation in the forward voltage of the polysilicon diode 22 is significantly smaller than the variation in the reverse voltage of the polysilicon diode 22, and therefore using the polysilicon diode 22 in the lateral protection device 20 makes it possible to reduce variation in the breakdown voltage thereof. Moreover, during abnormal operation the polysilicon diode 22 gets reverse-biased, thereby making it possible for the polysilicon diode 22 to reduce the impact of the parasitic effects of the diffusion diodes 21a to 21c, as described above.

Figure 6B:
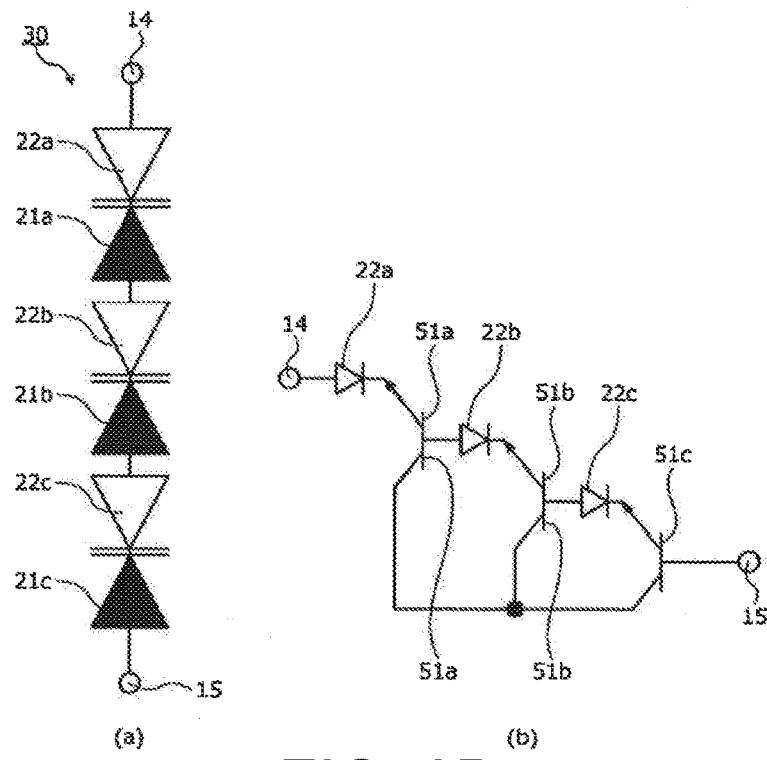
FIG. 6B illustrates another example of the semiconductor device according to Embodiment 1.

FIG. 6B is a circuit diagram illustrating another example of the semiconductor device according to Embodiment 1. FIG. 6B(a) is an equivalent circuit of a lateral protection device 30, and FIG. 6B(b) is an equivalent circuit illustrating a parasitic effect that occurs in the lateral protection device 30. FIG. 6B(a) illustrates an equivalent circuit for the lateral protection device 30, in which polysilicon diodes 22 are layered on top of all of the diffusion diodes 21a to 21c. The anode terminal of a furthest upstream polysilicon diode 22a functions as a first terminal 14 of the lateral protection device 30. The cathode terminals of the polysilicon diodes 22a to 22c are connected to the cathode terminals of the respective downstream diffusion diodes 21a to 21c. The anode terminals of the diffusion diodes 21a and 21b are connected to the anode terminals of the respective downstream polysilicon diodes 22b and 22c. The anode terminal of the furthest downstream diffusion diode 21c functions as a second terminal 15 of the lateral protection device 30. In this case, the polysilicon diodes 22a to 22c block the leakage currents flowing through the respective downstream diffusion diodes 21a to 21c. Therefore, none of the parasitic transistors 51a to 51c formed in the diffusion diodes 21a to 21c are activated.

As described above, in Embodiment 1 a polysilicon diode is reverse-connected upstream of the diffusion diodes. During normal operation, the diffusion diodes are reverse-biased, and the polysilicon diode is forward-biased. This makes it possible to clamp the voltage applied to the device to be protected to a value equal to the sum of the breakdown voltage of the diffusion diodes and the forward voltage of the polysilicon diode during normal operation. Moreover, the voltage applied to the device to be protected can be set in advance by changing the number of diffusion diodes used or the like, thereby making it possible to prevent a high voltage from being applied to the device to be protected. Furthermore, the polysilicon diode does not get biased in the reverse direction (in which the variation in voltage can be significant), thereby making it possible to reduce variations in the voltage applied to the device to be protected. In addition, during abnormal operation the polysilicon diode blocks any forward current flowing through the diffusion diodes, thereby making it possible to reduce the impact of the parasitic effects of the diffusion diodes. Moreover, no parasitic effects occur in the polysilicon diode. Therefore, even if a plurality of the diffusion diodes are connected in series to increase the voltage applied to the device to be protected, unexpected currents due to the parasitic effects of the diodes can be prevented from flowing through the circuit. This makes it possible to improve the reliability of the semiconductor device. Moreover, in Embodiment 1, the polysilicon diode is layered on top of the diffusion diode with a local insulating film interposed therebetween, thereby making it possible to prevent increases in the area of the device (that is, the area of the lateral protection device). This facilitates miniaturization of the overall semiconductor device.

Embodiment 2

Figure 7:
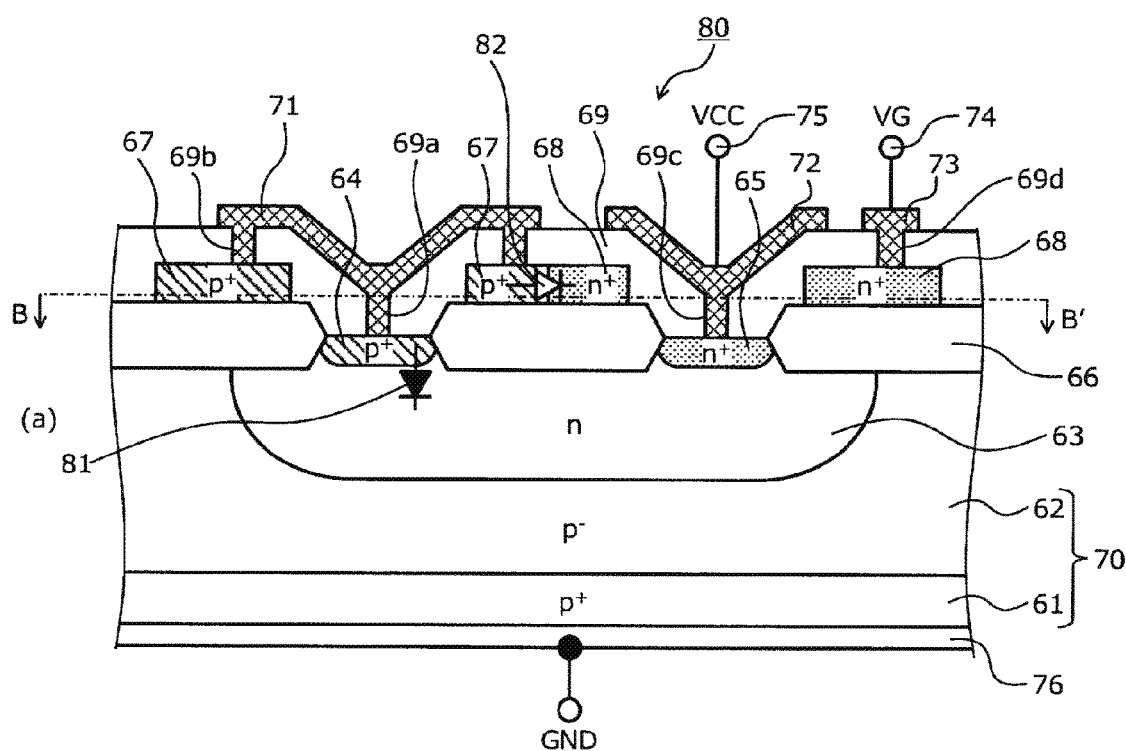
FIG. 7 illustrates the main components of the structure of a semiconductor device according to Embodiment 2.
Figure 8:
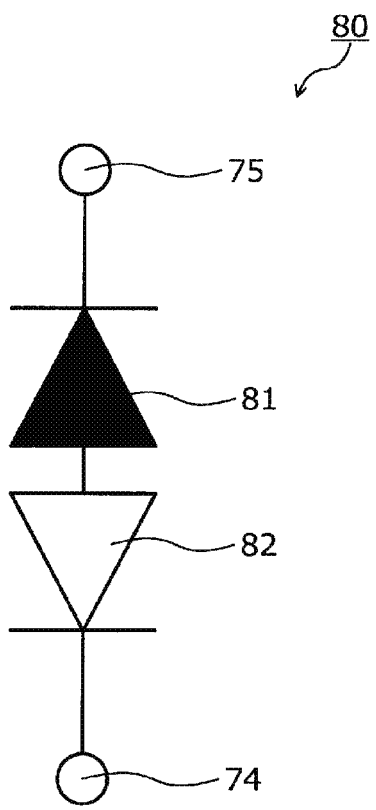
FIG. 8 is a circuit diagram illustrating an equivalent circuit for the configuration illustrated in FIG. 7.

Next, the structure of a semiconductor device according to Embodiment 2 will be described. FIG. 7 illustrates the main components of the structure of the semiconductor device according to Embodiment 2. FIG. 7 only depicts a lateral protection device 80 of the semiconductor device according to Embodiment 2, and other components are not illustrated in the figure. The planar layout of the lateral protection device 80 as taken along line B-B' in FIG. 7 is the same as the planar layout of the lateral protection device according to Embodiment 1 (see FIG. 1(b)) except in that the conductivity type (p-type or n-type) of each region is inverted. FIG. 8 is a circuit diagram illustrating an equivalent circuit for the configuration illustrated in FIG. 7. The semiconductor device according to Embodiment 2 is different than the semiconductor device according to Embodiment 1 in that the conductivity types (p-type or n-type) of the semiconductor substrate, the semiconductor regions (or semiconductor layers), and the polysilicon layers are inverted.

More specifically, the lateral protection device 80 is a protection device that provides gate protection for a p-channel MOSFET (not illustrated in the figure). A semiconductor substrate 70 is formed by layering a $p^-$ semiconductor layer 62 on the front surface of a $p^+$ supporting substrate 61. An n-type diffusion region 63 is selectively formed in the surface layer of the front surface (the surface on the $p^-$ semiconductor layer 62 side) of the semiconductor substrate 70. A $p^+$ diffusion region 64 and an $n^+$ diffusion region 65 are selectively formed and separated from one another in the surface layer on the front side of the n-type diffusion region 63. The $p^+$ diffusion region 64, the n-type diffusion region 63, and the $n^+$ diffusion region 65 respectively function as a p+ anode region, an n-type cathode contact region, and an n+ cathode region, and the resulting p+nn+ junction forms a diffusion diode 81.

Like in Embodiment 1, a local insulating film 66 is formed on the front surface of the semiconductor substrate 70 in regions thereof that are not occupied by the p+ diffusion region 64 or the n+ diffusion region 65. On top of the local insulating film 66, a p+ layer 67 of a polysilicon diode 82 is formed surrounding the periphery of the p+ diffusion region 64, and an n+ layer 68 of the polysilicon diode 82 is formed surrounding the periphery of the n+ diffusion region 65. The p+ layer 67 contacts the n+ layer 68. In other words, the p+ layer 67 and the n+ layer 68 respectively function as the p+ anode region and the n+ cathode region of the polysilicon diode 82.

Like the n+ layer of the polysilicon diode in Embodiment 1, the planar shape of the p+ layer 67 may be changed in a variety of ways, for example. Similarly, like the p+ layer of the polysilicon diode in Embodiment 1, the planar shape of the n+ layer 68 may also be changed in a variety of ways, for example. It is preferable that the areas of the p+ layer 67 and the n+ layer 68 be as large as possible. The reason for this is the same as in Embodiment 1. It is preferable that the impurity concentration of the p+ layer 67 be substantially equal to the impurity concentration of the p+ diffusion region 64. It is also preferable that the impurity concentration of the n+ layer 68 be substantially equal to the impurity concentration of the n+ diffusion region 65. The reason for this is the same as in Embodiment 1.

An interlayer insulating film 69 is formed on the front surface of the substrate, and a plurality of contact holes 69a to 69d are formed going through the interlayer insulating film 69 in the depth direction thereof, thereby respectively exposing the p+ diffusion region 64, the p+ layer 67, the n+ diffusion region 65 and the n+ layer 68. A first metal wire 71 is filled into the contact holes 69a and 69b and contacts the p+ diffusion region 64 and the p+ layer 67. The first metal wire 71 functions as the anode electrode of the diffusion diode 81 and the polysilicon diode 82. The planar shapes, arrangement, and connections between the first metal wire 71, the p+ diffusion region 64, and the p+ layer 67 are the same as those of the first metal wire, the n+ diffusion region of the diffusion diode, and the n+ layer of the polysilicon diode in Embodiment 1.

A second metal wire 72 is filled into the contact hole 69c and contacts the n+ diffusion region 65. The second metal wire 72 functions as the cathode electrode of the diffusion diode 81. The planar shapes, arrangement, and connections between the second metal wire 72 and the n+ diffusion region 65 are the same as those of the second metal wire and the p+ diffusion region of the diffusion diode in Embodiment 1. A third metal wire 73 is filled into the contact hole 69d and contacts the n+ layer 68. The third metal wire 73 functions as the cathode electrode of the polysilicon diode 82. The planar shapes, arrangement, and connections between the third metal wire 73 and the n+ layer 68 are the same as those of the third metal wire and the p+ layer of the polysilicon diode in Embodiment 1.

The anodes of the diffusion diode 81 and the polysilicon diode 82 are electrically connected to one another via the first metal wire 71. The third metal wire 73 (the cathode electrode of the polysilicon diode 82) functions as a first terminal 74 of the lateral protection device 80, and the second metal wire 72 (the cathode electrode of the diffusion diode 81) functions as a second terminal 75 of the lateral protection device 80. The first terminal 74 functions as a low voltage terminal on the low voltage side of the lateral protection device 80, and the second terminal 75 functions as a high voltage terminal on the high voltage side of the lateral protection device 80. When using the lateral protection device 80 to clamp the gate voltage applied to a p-channel MOSFET, for example, the first terminal 74 of the lateral protection device 80 is connected to the gate terminal VG of the p-channel MOSFET, and the second terminal 75 is connected to the source terminal of the same p-channel MOSFET. The external planar dimensions of the diffusion diode 81 and the polysilicon diode 82 as well as the layered structure of the diodes with the interlayer insulating film 69 interposed therebetween is the same as in Embodiment 1.

Like in Embodiment 1, when a plurality of diffusion diodes 81 are connected together in series, the first and second metal wires 71 and 72 are formed for each diffusion diode 81, and the polysilicon diode 82 is layered on top of at least the diffusion diode 81 that is arranged furthest upstream (towards the p-channel MOSFET side). The contact portions of the first to third metal wires 71 to 73 and the portions of the first to third metal wires 71 to 73 formed on top of the interlayer insulating film 69 are made from the same electrode material as in Embodiment 1 Like in Embodiment 1, a rear surface electrode 76 is formed on the rear surface of the semiconductor substrate 70 (that is, the rear surface of the p+ supporting substrate 61). The rear surface electrode 76 is connected to a GND terminal.

Figure 9:
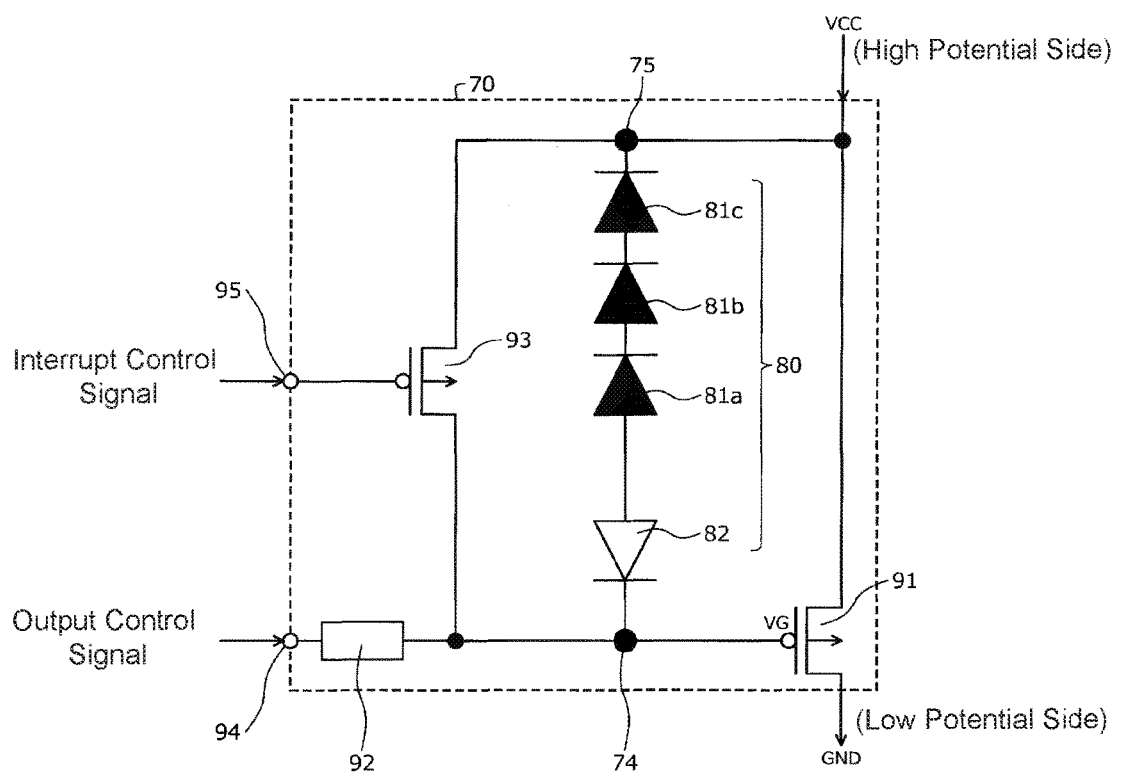
FIG. 9 is a circuit diagram illustrating an example of a circuit configuration for the semiconductor device according to Embodiment 2.

Next, an example in which the lateral protection device 80 is used to provide gate protection for an p-channel MOSFET will be described as an example of a power IC in which the lateral protection device 80 is used. FIG. 9 is a circuit diagram illustrating an example of a circuit configuration for the semiconductor device according to Embodiment 2. As illustrated in FIG. 9, the first terminal 74 of the lateral protection device 80 is connected between a first input terminal 94 and a gate terminal VG of a p-channel MOSFET (hereinafter, "first MOSFET") 91 for outputting current. The second terminal 75 of the lateral protection device 80 is connected to the source terminal of the first MOSFET 91. Moreover, a resistor 92 is connected between the first input terminal 94 and the first terminal 74 of the lateral protection device 80. The lateral protection device 80 and the resistor 92 step down the voltage of a high voltage output control signal input to the first input terminal 94 from an external device.

The lateral protection device 80 includes at least one polysilicon diode 82 and one or more diffusion diodes 81 that are connected together in series downstream of the polysilicon diode 82. Like in Embodiment 1, the prescribed clamping voltage of the lateral protection device 80 is equal to the sum of the breakdown voltage of the diffusion diodes 81 and the forward voltage of the second diode and can be adjusted by adjusting the number of diffusion diodes 81 that are connected in series. The number of diffusion diodes 81 that are used may be determined in the same way as in Embodiment 1. FIG. 9 depicts a case in which the lateral protection device 80 includes a single polysilicon diode 82 and a plurality of diffusion diodes 81 (here, three diffusion diodes 81a to 81c arranged in order from the upstream side) that are connected together in series downstream of the polysilicon diode 82. The cathode of the polysilicon diode 82 functions as the first terminal 74 of the lateral protection device 80, and the anode of the polysilicon diode 82 is connected to the anode of the downstream diffusion diode 81a. The cathodes of the diffusion diodes 81a and 81b are respectively connected to the anodes of the downstream diffusion diodes 81b and 81c. The cathode of the diffusion diode 81c functions as the second terminal 75 of the lateral protection device 80.

During normal operation when the output control signal is set to a Lo state, all of the diffusion diodes 81a to 81c are reverse-biased like in Embodiment 1. The drain terminal of an output interrupting p-channel MOSFET (hereinafter, "second MOSFET") 93 is connected between the resistor 92 and the first terminal 74 of the lateral protection device 80. The source terminal of the second MOSFET 93 is connected to the source terminal of the first MOSFET 91. The second MOSFET 93 is switched ON when an interrupt control signal generated by an interrupt signal circuit (not illustrated in the figure) and input to a second input terminal 95 is set to a Lo state, thereby interrupting the current output of the first MOSFET 91. During normal operation, the interrupt control signal is set to a Hi state and the second MOSFET 93 is in the OFF state, and the first terminal 74 of the lateral protection device 80 has a lower electric potential than the second terminal 75. Meanwhile, when abnormal operation occurs, the interrupt control signal is set to the Lo state and the second MOSFET 93 is switched ON, and the electric potential of the first terminal 74 of the lateral protection device 80 becomes substantially equal to the electric potential of the second terminal 75.

Next, the operation of the lateral protection device 80 will be described. An output control signal that turns the first MOSFET 91 ON and OFF is input to the first input terminal 94. The input voltage (the output control signal) is stepped down by the resistor 92 and the lateral protection device 80. While the output control signal remains in a Hi state, the first MOSFET 91 remains in the OFF state. However, when the output control signal is set to a Lo state, the polysilicon diode 82 gets forward-biased and the diffusion diodes 81a to 81c get reverse-biased and undergo breakdown, like in Embodiment 1. In this way, the lateral protection device 80 clamps the voltage applied to the gate terminal VG of the first MOSFET 91 to a prescribed voltage, like in Embodiment 1. This switches ON the first MOSFET 91, and current flows through the first MOSFET 91 to outside of the semiconductor device.

Meanwhile, when another protection circuit (not illustrated in the figure) detects that the power IC is in an abnormal operation state, the interrupt control signal input to the second input terminal 95 is set to the Lo state. This switches ON the output interrupting second MOSFET 93, thereby pulling down the voltage applied to the gate of the first MOSFET 91 and switching OFF the first MOSFET 91. As a result, the electric potential of the first terminal 74 of the lateral protection device 80 becomes substantially equal to the electric potential of the second terminal 75. Furthermore, the cathode of the diffusion diode 81b that is arranged in the middle position of the connected diffusion diodes 81a to 81c transitions to a floating state, and the base of a parasitic transistor (not illustrated in the figure) formed in the vertical direction in the diffusion diode 81b transitions to an open state. In Embodiment 2, the parasitic transistors formed in the vertical direction refer to the parasitic PNP transistors formed by the p⁻ semiconductor layer 62 and the n-type diffusion region 63 and the p⁺ diffusion region 64 of each diffusion diode 81.

When the base of the parasitic transistor is in the open state, a leakage current (not illustrated in the figure) flows from the first metal wire (anode) 71 through the parasitic PNP transistor formed in the diffusion diode 81b and towards the GND terminal on the rear surface of the substrate. This leakage current creates a forward current path through the diffusion diodes 81a to 81c that are connected in series. However, the resulting current that flows from the first terminal 74 towards the second terminal 75 is blocked by the polysilicon diode 82, which is reverse-connected to the diffusion diode 81a. In other words, no base current flows to a parasitic transistor formed in the vertical direction in the diffusion diode 81a. This makes it possible to prevent unexpected currents from flowing within the circuit due to the parasitic effects of the diffusion diode 81b during abnormal operation. Using the diffusion diodes 81a to 81c in combination with the polysilicon diode 82 to form the lateral protection device 80 achieves the same effects as in Embodiment 1.

As described above, Embodiment 2 makes it possible to achieve the same effects as in Embodiment 1 in a configuration in which a p-type semiconductor substrate is used.

Embodiment 3

Figure 10:
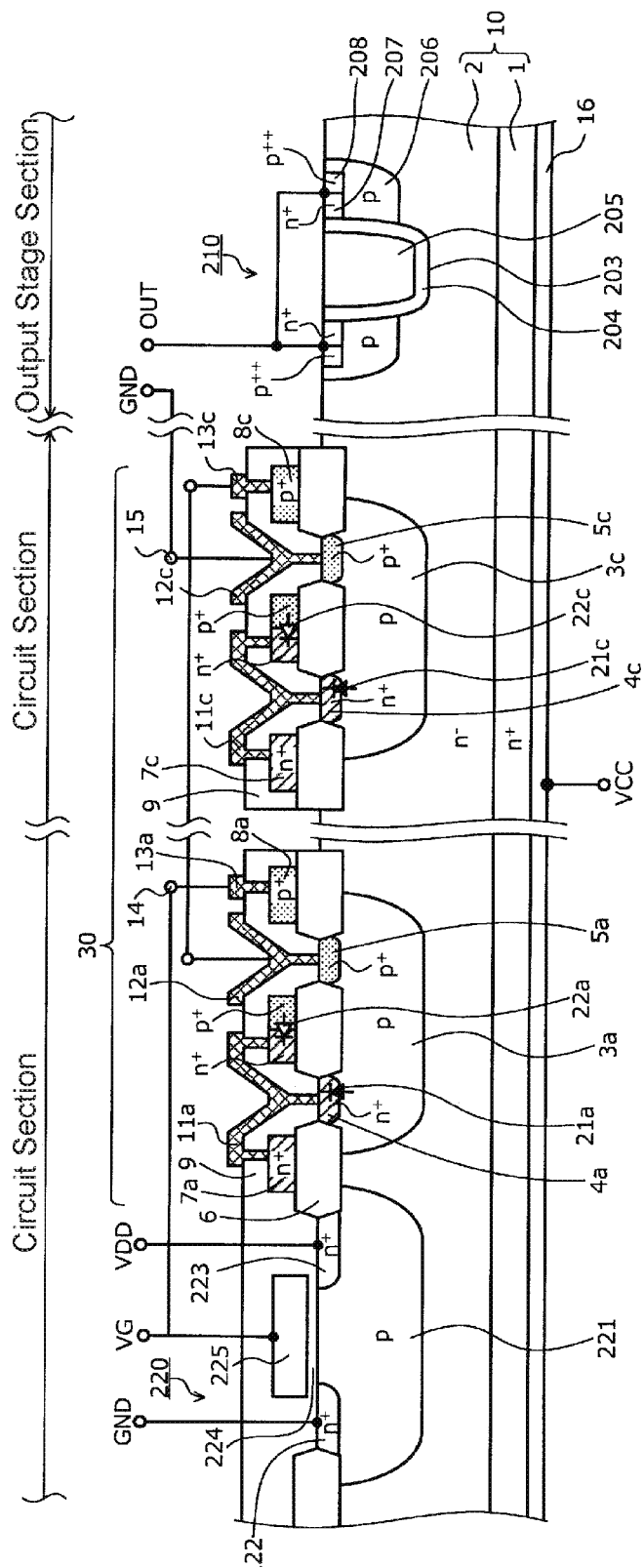
FIG. 10 illustrates the structure of a semiconductor device according to Embodiment 3.
Figure 11:
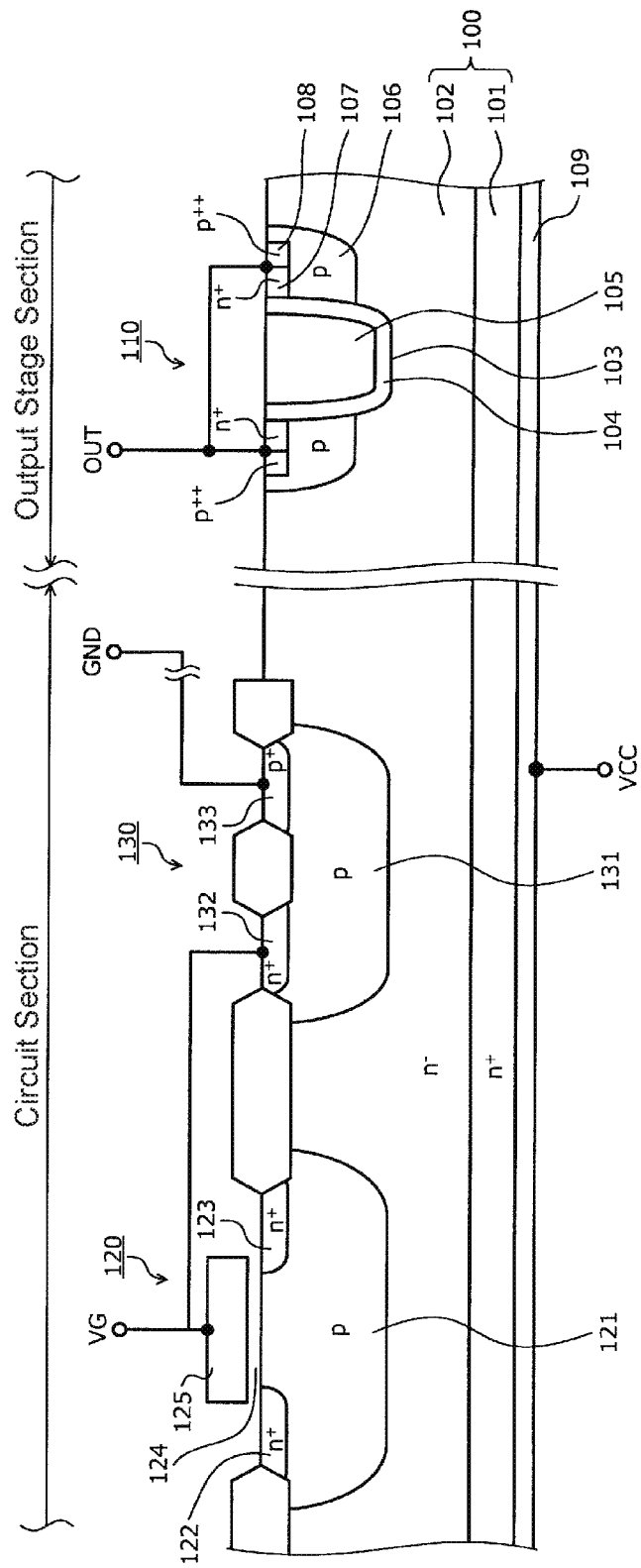
FIG. 11 is a cross-sectional view illustrating the structure of an example of a conventional semiconductor device.
Figure 12:
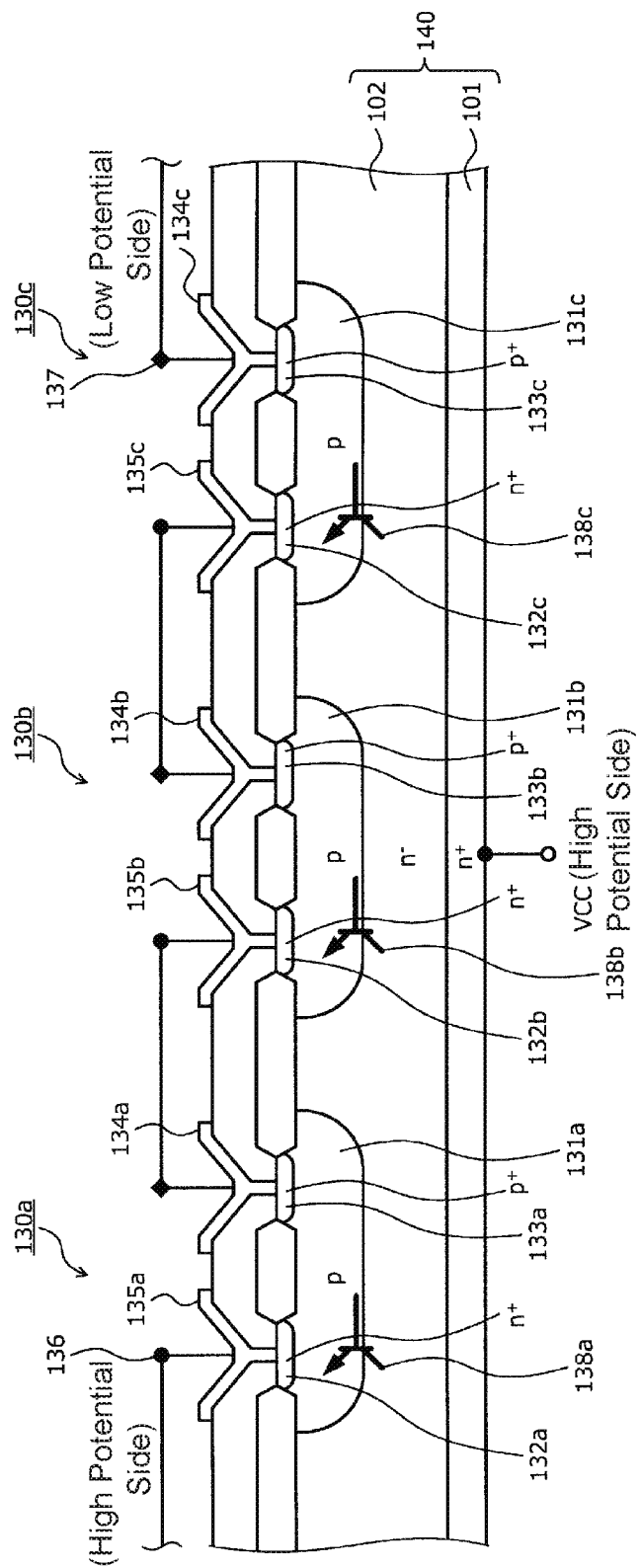
FIG. 12 is a cross-sectional view illustrating the structure of another example of a conventional lateral protection device.
Figure 13:
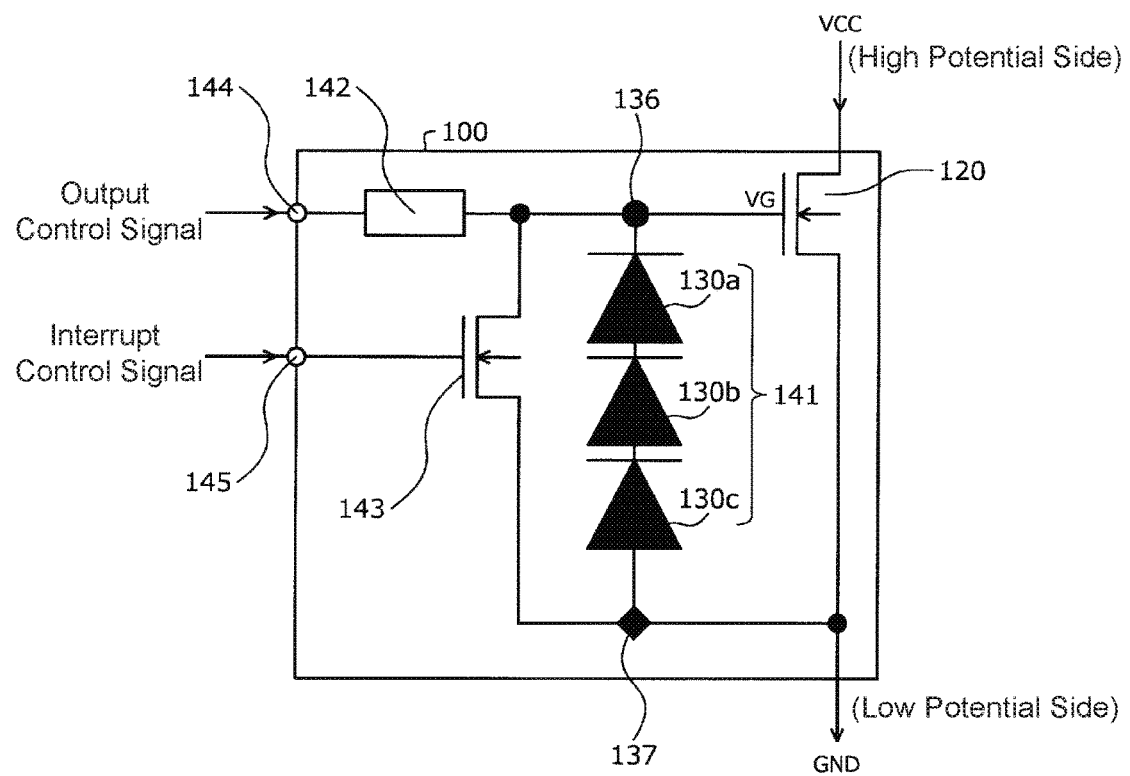
FIG. 13 is a circuit diagram of a power IC that includes the protection device illustrated in FIG. 12.
Figure 14:
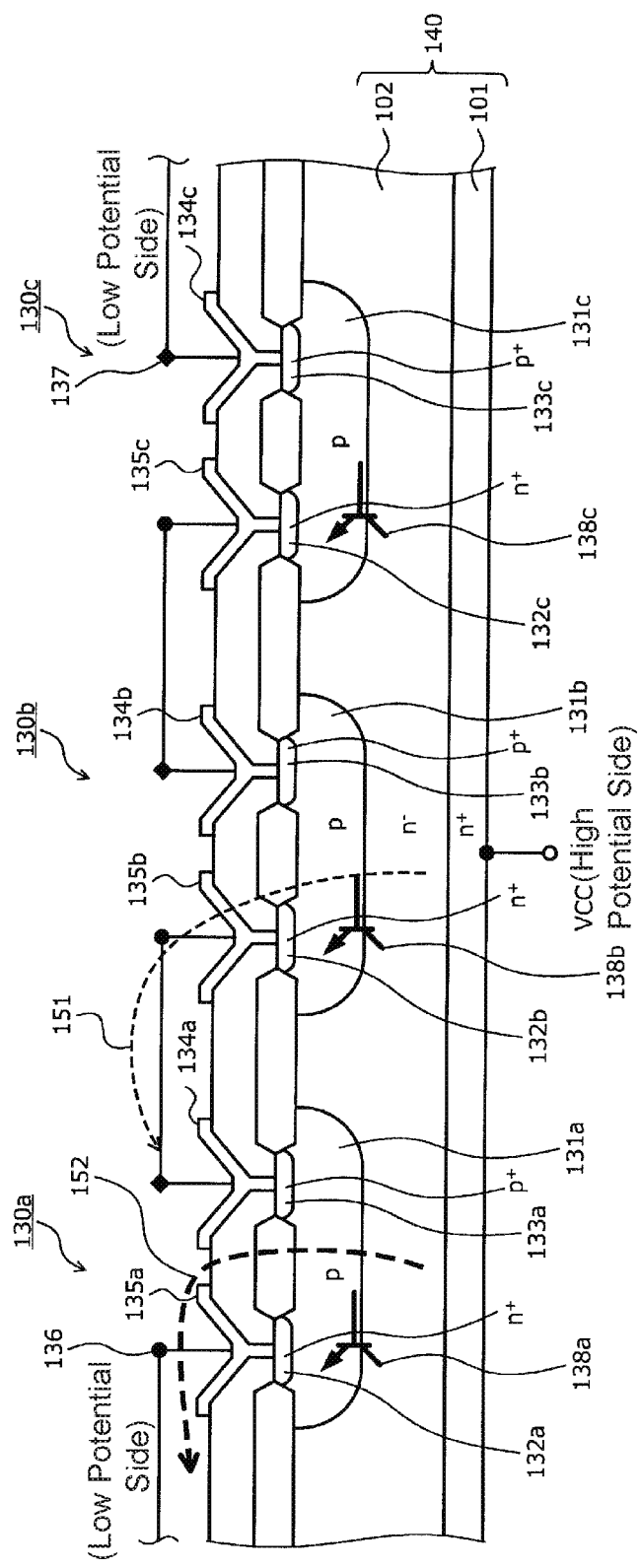
FIG. 14 illustrates a parasitic effect that occurs in the power IC that includes the protection device illustrated in FIG. 12.
Figure 15:
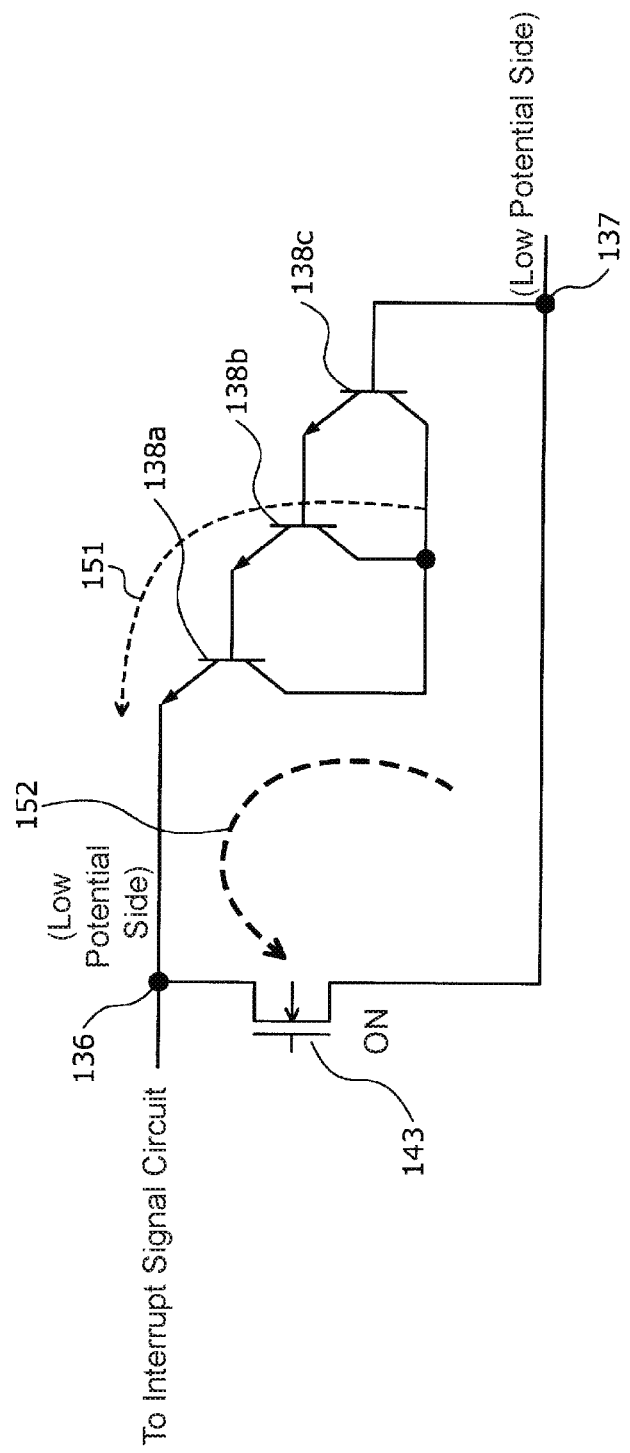
FIG. 15 is a circuit diagram illustrating an equivalent circuit for the parasitic transistors illustrated in FIG. 14.

A semiconductor device according to Embodiment 3 includes the lateral protection device 30 of Embodiment 1 (see FIG. 6B) as well as other components that are arranged on the same semiconductor substrate 10. FIG. 10 illustrates the structure of the semiconductor device according to Embodiment 3. FIG. 10 illustrates an example of a high-side power IC for use in a vehicle that includes an output stage vertical MOSFET 210, a lateral CMOS which is a circuit device for a control circuit for the vertical MOSFET 210, and the lateral protection device 30, which are all arranged on the same semiconductor substrate 10. The power IC also includes a lateral p-channel MOSFET and a lateral n-channel MOSFET connected together complementarily to form the lateral CMOS. However, FIG. 10 only depicts the lateral n-channel MOSFET 220. The lateral protection device 30 protects a gate electrode 225 of the lateral n-channel MOSFET 220.

More specifically, the semiconductor substrate 10 includes an output stage portion in which the output stage vertical MOSFET 210 is arranged and circuit portions in which components such as the lateral CMOS for the control circuit and the lateral protection device 30 are arranged. The vertical MOSFET 210, the lateral CMOS, and the lateral protection device 30 each include active elements and passive elements produced using a typical CMOS manufacturing process, for example. An output terminal (hereinafter, "OUT terminal") and a GND terminal are formed on the front surface side of the semiconductor substrate 10. A rear surface electrode 16 (a drain terminal) of the vertical MOSFET 210 is connected to the rear surface of the supporting substrate 10 and functions as a supply voltage terminal (a VCC terminal) that is connected to a vehicle battery. In the output stage portion, the n⁺ supporting substrate 1 and the n⁻ semiconductor layer 2 respectively function as an n⁺ drain layer and an n⁻ drift layer of the vertical MOSFET 210.

The vertical MOSFET 210 is a trench-gate metal-oxide-semiconductor (MOS) insulated gate that includes a trench 203, a gate insulating film 204, a gate electrode 205, a p-type base region 206, an n⁺ source region 207, and a p⁺⁺ diffusion region 208, for example. The p-type base region 206 is selectively formed in the surface layer of the front surface of the semiconductor substrate 10. The n⁺ source region 207 and the p⁺⁺ diffusion region 208 are selectively formed within the p-type base region 206. The trench 203 goes through the n⁺ source region 207 and the p-type base region 206 and extends down into the n⁻ semiconductor layer 2. The gate electrode 205 is formed inside the trench 203 with the gate insulating film 204 interposed therebetween. The n⁺ source region 207 and the p++ diffusion region 208 contact a source electrode (a front surface electrode (source terminal) that is not illustrated in the figure) and are connected to the OUT terminal.

The lateral n-channel MOSFET 220 is a planar-gate MOS gate that includes a p-type base region 221, an n+ source region 222, an n+ drain region 223, a gate insulating film 224, and the gate electrode 225. The p-type base region 221 is selectively formed in the surface layer of the front surface of the substrate and separated from the p-type base region 206 of the vertical MOSFET 210. The n+ source region 222 and the n+ drain region 223 are selectively formed and separated from one another within the p-type base region 221. The gate electrode (gate terminal) 225 is formed on the surface portion between the n+ source region 222 and the n+ drain region 223 of the p-type base region 221 with the gate insulating film 224 interposed therebetween. The n+ source region 222 contacts a source electrode (a source terminal that is not illustrated in the figure) and is connected to the GND terminal. The n+ drain region 223 contacts a drain electrode (a drain terminal that is not illustrated in the figure). The drain electrode of the lateral n-channel MOSFET 220 functions as a VDD terminal for applying a voltage between the source and drain of the lateral n-channel MOSFET 220.

The lateral protection device 30 is arranged in a p-type diffusion region 3 that is selectively formed in the surface layer of the front surface of the semiconductor substrate 10. The p-type diffusion region 3 is separated from the p-type base region 206 of the vertical MOSFET 210 and the p-type base region 221 of the lateral n-channel MOSFET 220. The n+ diffusion region 4, the p+ diffusion region 5, the local insulating film 6, the n+ layer 7, the p+ layer 8, the interlayer insulating film 9, and the first to third metal wires 11 to 13 are configured the same as in Embodiment 1. In the lateral protection device 30, polysilicon diodes 22 are layered on top of all of the diffusion diodes 21 (here, three diodes) that are connected in series. In the lateral protection device 30, the connections between each diffusion diode 21 and each polysilicon diode 22 are the same as in the lateral protection device in the other example of the semiconductor device according to Embodiment 1, which is illustrated in FIG. 6B.

In the lateral protection device 30, the letter "a" is appended to the reference characters of components that are part of the diffusion diode 21a and the polysilicon diode 22a, which are arranged the furthest upstream (towards the lateral n-channel MOSFET 220 side). Similarly, the letter "c" is appended to the reference characters of components that are part of the diffusion diode 21c and the polysilicon diode 22c, which are arranged the furthest downstream. The third metal wire (anode terminal) 13a of the furthest upstream polysilicon diode 22a functions as the first terminal 14 of the lateral protection device 30 and is connected to the gate electrode 225 of the lateral n-channel MOSFET 220. The second metal wire (anode terminal) 12c of the furthest downstream diffusion diode 21c functions as the second terminal 15 of the lateral protection device 30 and is connected to the GND terminal.

Moreover, Embodiment 2 may be applied to Embodiment 3 to achieve a configuration in which the conductivity types of the semiconductor substrate, the semiconductor regions (or semiconductor layers), and the polysilicon layers are inverted.

As described above, Embodiment 3 makes it possible to achieve the same effects as in Embodiments 1 and 2 in a configuration in which other components are arranged on the same semiconductor substrate as the n-channel MOSFET and the lateral protection device that protects the n-channel MOSFET.

A variety of modifications may be made to the present invention without departing from the spirit of the present invention as described above. For example, in the embodiments described above, the number of diffusion diodes and polysilicon diodes used to form the lateral protection device, the dimensions or impurity concentrations of each portion of the device, or the like can be configured as necessary to meet design requirements or the like. Moreover, in the embodiments described above, the gate insulating film of a lateral planar-gate MOSFET is protected. However, the present invention is not limited to this example and may be applied to protect lateral semiconductor devices other than MOSFETs (such as insulated-gate bipolar transistors (IGBTs)) or to protect vertical semiconductor devices, trench-gate semiconductor devices, locations other than gate insulating films to which high voltages are applied, or the like, for example. Furthermore, in Embodiment 3, semiconductor devices other than an output stage semiconductor device or a control circuit semiconductor device may be arranged on the same semiconductor substrate as the lateral semiconductor device. In each embodiment, n-type was a first conductivity type and p-type was a second conductivity type.

INDUSTRIAL APPLICABILITY

As described above, the semiconductor device and method of manufacturing the semiconductor device according to the present invention make it possible to achieve advantageous effects in semiconductor devices that include, on the same semiconductor substrate, a vertical semiconductor element and a lateral protection device that protects the vertical semiconductor element or a control circuit therefor. The present invention is particularly well-suited to application in semiconductor devices that include a lateral protection device that protects the gate of a MOS-type semiconductor element.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A semiconductor device, comprising:
a semiconductor substrate of a first conductivity type;
a first semiconductor region of a second conductivity type that is selectively formed in a surface layer of a front surface of the semiconductor substrate;
a second semiconductor region of the first conductivity type that is selectively formed in the first semiconductor region;
a third semiconductor region of the second conductivity type that is selectively formed in the first semiconductor region and separated from the second semiconductor region and that has a higher impurity concentration than the first semiconductor region;
a fourth semiconductor region of the first conductivity type that is selectively formed on the front surface of the semiconductor substrate with an insulating film interposed therebetween, said fourth semiconductor region being made of a polycrystalline silicon layer;
a fifth semiconductor region of the second conductivity type that is selectively formed on the front surface of the semiconductor substrate with said insulating film interposed therebetween, said fifth semiconductor region being made of a polycrystalline silicon layer that contacts the fourth semiconductor region;
a first electrode that contacts the second semiconductor region and the fourth semiconductor region;
a second electrode that contacts the third semiconductor region; and
a third electrode that contacts the fifth semiconductor region,
wherein the first semiconductor region faces the fourth semiconductor region and the fifth semiconductor region in a depth direction.

2. The semiconductor device according to claim 1, wherein the semiconductor device has a planar layout in which the fourth semiconductor region is arranged in a planar shape that surrounds the second semiconductor region.

3. The semiconductor device according to claim 2, wherein the semiconductor device has a planar layout in which a contact portion between the fourth semiconductor region and the first electrode is arranged in a planar shape that surrounds the second semiconductor region.

4. The semiconductor device according to claim 1, wherein the semiconductor device has a planar layout in which the fifth semiconductor region is arranged in a planar shape that surrounds the third semiconductor region.

5. The semiconductor device according to claim 4, wherein the semiconductor device has a planar layout in which a contact portion between the fifth semiconductor region and the third electrode is arranged in a planar shape that surrounds the third semiconductor region.

6. The semiconductor device according to claim 1,
wherein a first diode is formed by a p-n junction between the first semiconductor region and the second semiconductor region,
wherein a second diode is formed by a p-n junction between the fifth semiconductor region and the fourth semiconductor region, and
wherein the first diode faces the second diode in the depth direction.

7. The semiconductor device according to claim 1,
wherein a plurality of said first semiconductor regions are arranged in series, separated from one another,
wherein each of the plurality of the first semiconductor regions includes said second semiconductor region and said third semiconductor region therein, and has the first electrode connected to said second semiconductor region and the second electrode connected to said third semiconductor region,
wherein one of the plurality of the first semiconductor regions that is located at an end of the series has said fourth semiconductor region and said fifth semiconductor region that face the first semiconductor region in the depth direction, and has said third electrode connected to said fifth semiconductor region,
wherein the second semiconductor region in said one of the plurality of the first semiconductor regions is electrically connected to the fourth semiconductor region via the first electrode, and
wherein the third semiconductor region in respective one of the plurality of the first semiconductor regions is electrically connected to the second semiconductor region in another of the plurality of the first semiconductor regions so that said plurality of the first semiconductor regions with the second and third semiconductor regions are electrically connected in series.

8. The semiconductor device according to claim 7,
wherein in each of the plurality of the first semiconductor regions, a first diode is formed by a p-n junctions between the first semiconductor region and the second semiconductor region that contacts the first semiconductor region so that a plurality of the first diodes are respectively formed in the plurality of the first semiconductor regions and are electrically connected in series.

9. The semiconductor device according to claim 8,
wherein a second diode is formed by a p-n junction between the fifth semiconductor region and the fourth semiconductor region in said one of the plurality of the first semiconductor regions, and
wherein in said one of the plurality of the first semiconductor regions, the first diode faces the second diode in the depth direction.

10. The semiconductor device according to claim 9, wherein in said one of the plurality of the first semiconductor regions, an entirety of the first diode faces the second diode in the depth direction.

11. A semiconductor device unit, comprising:
a plurality of said semiconductor devices each as set forth in claim 1,
wherein the second electrode in respective one of the plurality of said semiconductor devices is electrically connected to, or is shared with, the third electrode in another of the plurality of said semiconductor devices so that the plurality of said semiconductor devices are connected in series.

12. The semiconductor device unit according to claim 11,
wherein, in each of the plurality of the semiconductor devices:
a first diode is formed by a p-n junction between the first semiconductor region and the second semiconductor region,
a second diode is formed by a p-n junction between the fifth semiconductor region and the fourth semiconductor region, and
the first diode faces the second diode in the depth direction.

13. The semiconductor device unit according to claim 12, wherein, in each of the plurality of the semiconductor devices, an entirety of the first diode faces, in the depth direction, the second diode.

14. The semiconductor device according to claim 6, further comprising:
a semiconductor element on a front surface side of the semiconductor substrate, said semiconductor element having an insulated gate structure made of metal-oxide film-semiconductor; and
an input terminal to which a control signal that switches the semiconductor element ON and OFF is input,
wherein the third electrode is connected between the input terminal and a gate of the semiconductor element, and
wherein when an ON signal is provided to the input terminal, the first diode undergoes breakdown in accordance with the control signal, thereby fixing the third electrode to a higher electric potential than the second electrode.

15. The semiconductor device according to claim 1, wherein an impurity concentration of the second semiconductor region is equal to an impurity concentration of the fourth semiconductor region.

16. The semiconductor device according to claim 1, wherein an impurity concentration of the third semiconductor region is equal to an impurity concentration of the fifth semiconductor region.

17. The semiconductor device according to claim 1, further comprising:
 a vertical semiconductor element that includes a fourth electrode disposed on the front surface of the semiconductor substrate as a front surface electrode, and a fifth electrode disposed on a rear surface of the semiconductor substrate as a rear surface electrode, said fifth electrode being configured to receive a higher electric potential than the fourth electrode.

18. A method of manufacturing a semiconductor device that includes a semiconductor substrate of a first conductivity type; a first semiconductor region of a second conductivity type that is selectively formed in a surface layer of a front surface of the semiconductor substrate; a second semiconductor region of the first conductivity type that is selectively formed in the first semiconductor region; a third semiconductor region of the second conductivity type that is selectively formed in the first semiconductor region and separated from the second semiconductor region and that has a higher impurity concentration than the first semiconductor region; a fourth semiconductor region of the first conductivity type that is selectively formed on the front surface of the semiconductor substrate with an insulating film interposed therebetween, said fourth semiconductor region being made of a polycrystalline silicon layer; a fifth semiconductor region of the second conductivity type that is selectively formed on the front surface of the semiconductor substrate with said insulating film interposed therebetween, said fifth semiconductor region being made of a polycrystalline silicon layer that contacts the fourth semiconductor region; a first electrode that contacts the second semiconductor region and the fourth semiconductor region; a second electrode that contacts the third semiconductor region; and a third electrode that contacts the fifth semiconductor region, the method comprising:
 selectively forming the first semiconductor region in the surface layer of the front surface of the semiconductor substrate;
 forming, on the front surface of the semiconductor substrate, the insulating film that covers portions of the first semiconductor region;
 forming, on the insulating film, a polycrystalline silicon layer that faces the first semiconductor region in a depth direction;
 selectively forming, via ion implantation, the second semiconductor region within the first semiconductor region, and the fourth semiconductor region in the polycrystalline silicon layer; and
 selectively forming, via ion implantation, the third semiconductor region within the first semiconductor region, and the fifth semiconductor region in the polycrystalline silicon layer.

\* \* \* \* \*

UNITED STATES PATENT AND TRADEMARK OFFICE
CERTIFICATE OF CORRECTION

PATENT NO. : 9,613,945 B1  
APPLICATION NO. : 15/232562  
DATED : April 4, 2017  
INVENTOR(S) : Toyoda Page 1 of 1

It is certified that error appears in the above-identified patent and that said Letters Patent is hereby corrected as shown below:

In the Specification

Column 15, Line 22, delete "Sc" and insert -- 5c --.

Signed and Sealed this
Thirtieth Day of May, 2017

Michelle K. Lee
*Director of the United States Patent and Trademark Office*